(12) United States Patent
Kato et al.

(10) Patent No.: US 10,319,765 B2
(45) Date of Patent: Jun. 11, 2019

(54) IMAGING DEVICE HAVING AN EFFECTIVE PIXEL REGION, AN OPTICAL BLACK REGION AND A DUMMY REGION EACH WITH PIXELS INCLUDING A PHOTOELECTRIC CONVERTER

(71) Applicant: CANON KABUSHIKI KAISHA, Tokyo (JP)

(72) Inventors: Taro Kato, Tokyo (JP); Akira Okita, Yamato (JP); Takehito Okabe, Yokohama (JP); Takeru Ohya, Machida (JP); Kosuke Asano, Yokohama (JP); Koichiro Iwata, Kawasaki (JP); Seiichirou Sakai, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 49 days.

(21) Appl. No.: 15/622,595

(22) Filed: Jun. 14, 2017

(65) Prior Publication Data

US 2018/0006071 A1    Jan. 4, 2018

(30) Foreign Application Priority Data

Jul. 1, 2016 (JP) ................................. 2016-131351
Apr. 12, 2017 (JP) ................................. 2017-078633

(51) Int. Cl.
*H04N 7/18* (2006.01)
*G06T 7/536* (2017.01)
(Continued)

(52) U.S. Cl.
CPC ........ *H01L 27/14625* (2013.01); *G06T 7/536* (2017.01); *H01L 27/14623* (2013.01);
(Continued)

(58) Field of Classification Search
CPC . G06T 2207/10004; G06T 2207/30252; G06T 7/536; H01L 27/14621;
(Continued)

(56) References Cited

U.S. PATENT DOCUMENTS 4,663,669 A    5/1987 Kinoshita et al. .......... 348/220.1
4,774,585 A    9/1988 Suga et al. .................... 348/318
(Continued)

FOREIGN PATENT DOCUMENTS

JP    2009-164247    7/2009
JP    2012-164944    8/2012
(Continued)

OTHER PUBLICATIONS

U.S. Appl. No. 15/589,830, filed May 8, 2017.
(Continued)

*Primary Examiner* — Amy R Hsu
(74) *Attorney, Agent, or Firm* — Venable LLP

(57) ABSTRACT

An imaging device includes a pixel region in which a plurality of pixels, each including a photoelectric converter, are arranged, including an effective pixel region, an optical black region covered with a light-shielding film, and a dummy pixel region arranged between the effective pixel region and the optical black region. The pixels arranged in at least the effective pixel region and the optical black region among the plurality of the pixels each include an optical waveguide arranged above the photoelectric converter. The pixels including the optical waveguides are arranged between the effective pixel region and the optical black region so as to be spaced apart from each other by at least a one-pixel pitch.

40 Claims, 22 Drawing Sheets

(51) Int. Cl.
  *H04N 5/355* (2011.01)
  *H04N 5/361* (2011.01)
  *H04N 5/374* (2011.01)
  *H04N 5/378* (2011.01)
  *H01L 27/146* (2006.01)

(52) U.S. Cl.
  CPC ............ *H04N 5/355* (2013.01); *H04N 5/361* (2013.01); *H04N 5/374* (2013.01); *H04N 5/378* (2013.01); *H04N 7/183* (2013.01); *G06T 2207/10004* (2013.01); *G06T 2207/30252* (2013.01); *H01L 27/14621* (2013.01); *H01L 27/14627* (2013.01)

(58) Field of Classification Search
  CPC ......... H01L 27/14623; H01L 27/14625; H01L 27/14627; H04N 5/355; H04N 5/361; H04N 5/374; H04N 5/378; H04N 7/183
  See application file for complete search history.

(56) References Cited

U.S. PATENT DOCUMENTS

| | | | |
|---|---|---|---|
| 4,780,764 A | 10/1988 | Kinoshita et al. | 348/296 |
| 4,821,105 A | 4/1989 | Suga et al. | 348/220.1 |
| 7,187,052 B2 | 3/2007 | Okita et al. | 257/444 |
| 7,227,208 B2 | 6/2007 | Ogura et al. | 257/292 |
| 7,283,305 B2 | 10/2007 | Okita et al. | 359/619 |
| 7,294,818 B2 | 11/2007 | Matsuda et al. | 250/208.1 |
| 7,321,110 B2 | 1/2008 | Okita et al. | 250/208.1 |
| 7,408,210 B2 | 8/2008 | Ogura et al. | 257/233 |
| 7,456,880 B2 | 11/2008 | Okita et al. | 348/243 |
| 7,460,162 B2 | 12/2008 | Koizumi et al. | 348/294 |
| 7,466,003 B2 | 12/2008 | Ueno et al. | 257/462 |
| 7,514,732 B2 | 4/2009 | Okita et al. | 257/292 |
| 7,531,885 B2 | 5/2009 | Okita et al. | 257/444 |
| 7,538,804 B2 | 5/2009 | Okita et al. | 348/241 |
| 7,538,810 B2 | 5/2009 | Koizumi et al. | 348/308 |
| 7,550,793 B2 | 6/2009 | Itano et al. | 257/239 |
| 7,557,847 B2 | 7/2009 | Okita et al. | 348/308 |
| 7,605,415 B2 | 10/2009 | Koizumi et al. | 257/291 |
| 7,629,568 B2 | 12/2009 | Koizumi et al. | 250/214 R |
| 7,638,826 B2 | 12/2009 | Hiyama et al. | 257/291 |
| 7,646,493 B2 | 1/2010 | Okita et al. | 356/620 |
| 7,688,377 B2 | 3/2010 | Matsuda et al. | 348/340 |
| 7,741,593 B2 | 6/2010 | Iwata et al. | 250/214 R |
| 7,812,873 B2 | 10/2010 | Hiyama et al. | 348/294 |
| 7,872,286 B2 | 1/2011 | Okita et al. | 257/291 |
| 7,906,755 B2 | 3/2011 | Koizumi et al. | 250/214 R |
| 7,943,975 B2 | 5/2011 | Koizumi et al. | 257/291 |
| 7,978,241 B2 | 7/2011 | Koizumi et al. | 348/300 |
| 7,993,951 B2 | 8/2011 | Okabe et al. | 438/59 |
| 8,009,213 B2 | 8/2011 | Okita et al. | 348/300 |
| 8,013,369 B2 | 9/2011 | Iwata et al. | 257/290 |
| 8,053,718 B2 | 11/2011 | Koizumi et al. | 250/214 R |
| 8,063,958 B2 | 11/2011 | Okita et al. | 348/241 |
| 8,081,245 B2 | 12/2011 | Itano et al. | 348/301 |
| 8,089,545 B2 | 1/2012 | Koizumi et al. | 348/308 |
| 8,106,343 B2 | 1/2012 | Arishima et al. | 250/208.1 |
| 8,106,955 B2 | 1/2012 | Okita et al. | 348/220.1 |
| 8,134,190 B2 | 3/2012 | Okita et al. | 257/292 |
| 8,158,920 B2 | 4/2012 | Suzuki et al. | 250/208.1 |
| 8,159,573 B2 | 4/2012 | Suzuki et al. | 348/294 |
| 8,159,577 B2 | 4/2012 | Iwata et al. | 348/296 |
| 8,189,086 B2 | 5/2012 | Hashimoto et al. | 348/300 |
| 8,199,235 B2 | 6/2012 | Okita et al. | 348/301 |
| 8,207,561 B2 | 6/2012 | Koizumi et al. | 257/291 |
| 8,278,613 B2 | 10/2012 | Okita et al. | 250/214 A |
| 8,293,559 B2 | 10/2012 | Okabe et al. | 438/59 |
| 8,355,066 B2 | 1/2013 | Iwata et al. | 348/296 |
| 8,368,790 B2 | 2/2013 | Itano et al. | 348/301 |
| 8,390,708 B2 | 3/2013 | Koizumi et al. | 348/294 |
| 8,415,724 B2 | 4/2013 | Iwata et al. | 257/290 |
| 8,416,329 B2 | 4/2013 | Hiyama et al. | 348/294 |
| 8,421,894 B2 | 4/2013 | Koizumi et al. | 348/308 |
| 8,427,567 B2 | 4/2013 | Okita et al. | 348/308 |
| 8,441,558 B2 | 5/2013 | Okita et al. | 348/241 |
| 8,508,010 B2 | 8/2013 | Maruyama | |
| 8,514,309 B2 | 8/2013 | Kato et al. | 348/294 |
| 8,525,896 B2 | 9/2013 | Okita et al. | 348/222.1 |
| 8,552,481 B2 | 10/2013 | Hiyama et al. | 257/292 |
| 8,553,101 B2 | 10/2013 | Okita et al. | 348/220.1 |
| 8,582,003 B2 | 11/2013 | Sakai | 348/241 |
| 8,598,901 B2 | 12/2013 | Hiyama et al. | 324/750.3 |
| 8,624,307 B2 | 1/2014 | Koizumi et al. | 257/291 |
| 8,643,765 B2 | 2/2014 | Takada et al. | 348/340 |
| 8,670,051 B2 | 3/2014 | Kato | 348/272 |
| 8,670,058 B2 | 3/2014 | Hayashi et al. | 348/296 |
| 8,698,935 B2 | 4/2014 | Okita et al. | 348/314 |
| 8,749,675 B2 | 6/2014 | Koizumi et al. | 348/294 |
| 8,749,683 B2 | 6/2014 | Minowa et al. | 348/308 |
| 8,872,092 B2 | 10/2014 | Ryoki et al. | 250/214 R |
| 8,883,526 B2 | 11/2014 | Okita et al. | 438/24 |
| 8,885,082 B2 | 11/2014 | Noda et al. | 348/294 |
| 8,896,029 B2 | 11/2014 | Koizumi et al. | 257/202 |
| 8,913,166 B2 | 12/2014 | Okita | 348/294 |
| 8,928,786 B2 | 1/2015 | Iwata et al. | 348/294 |
| 8,957,364 B2 | 2/2015 | Ryoki et al. | 250/214 R |
| 9,053,996 B2 | 6/2015 | Iwane et al. | H04N 5/3658 |
| 9,093,345 B2 | 7/2015 | Kato et al. | H01L 27/14641 |
| 9,093,351 B2 | 7/2015 | Sakai et al. | H01L 27/14806 |
| 9,118,857 B2 | 8/2015 | Iwata et al. | H04N 5/378 |
| 9,142,575 B2 | 9/2015 | Kobayashi et al. | H04N 5/37455 |
| 9,147,708 B2 | 9/2015 | Okita et al. | H01L 27/1461 |
| 9,214,491 B2 | 12/2015 | Okita | H04N 5/347 |
| 9,231,022 B2 | 1/2016 | Hiyama et al. | H04N 5/37457 |
| 9,232,164 B2 | 1/2016 | Minowa et al. | H04N 5/378 |
| 9,253,425 B2 | 2/2016 | Ryoki et al. | H01L 27/14603 |
| 9,276,027 B2 | 3/2016 | Okita et al. | H01L 27/14812 |
| 9,300,884 B2 | 3/2016 | Minowa et al. | H01L 27/14812 |
| 9,432,607 B2 | 8/2016 | Morita et al. | H04N 5/3698 |
| 9,478,575 B2 | 10/2016 | Kato | H01L 27/14625 |
| 9,497,403 B2 | 11/2016 | Iwane et al. | H04N 3/155 |
| 9,595,559 B2 | 3/2017 | Hiyama et al. | H04N 5/37452 |
| 9,667,901 B2 | 5/2017 | Sakai et al. | H04N 5/3745 |
| 9,681,076 B2 | 6/2017 | Oguro et al. | H04N 5/3698 |
| 9,716,823 B2 | 7/2017 | Iwata et al. | H04N 5/23212 |
| 2005/0174552 A1 | 8/2005 | Takada et al. | 355/53 |
| 2007/0205439 A1 | 9/2007 | Okita et al. | 257/228 |
| 2009/0201406 A1 | 8/2009 | Okita et al. | 348/308 |
| 2010/0157083 A1 | 6/2010 | Ohya et al. | 348/222.1 |
| 2010/0230578 A1* | 9/2010 | Horikoshi | H01L 27/14625 250/208.1 |
| 2010/0321532 A1 | 12/2010 | Hashimoto et al. | 348/234 |
| 2011/0149137 A1* | 6/2011 | Koike | H01L 27/14603 348/308 |
| 2012/0019708 A1* | 1/2012 | Morihisa | G02B 7/30 348/348 |
| 2012/0105670 A1 | 5/2012 | Arishima et al. | 348/223.1 |
| 2012/0181590 A1 | 7/2012 | Okita et al. | 257/292 |
| 2012/0201528 A1* | 8/2012 | Aoki | H04N 13/0239 396/325 |
| 2013/0113966 A1 | 5/2013 | Arishima et al. | 348/301 |
| 2013/0181118 A1 | 7/2013 | Koizumi et al. | 250/208.1 |
| 2013/0194468 A1 | 8/2013 | Okita | 348/294 |
| 2014/0002684 A1 | 1/2014 | Okita et al. | 348/220.1 |
| 2014/0035086 A1 | 2/2014 | Kato | 257/432 |
| 2014/0098196 A1* | 4/2014 | Guan | G06K 9/00798 348/47 |
| 2014/0117211 A1 | 5/2014 | Arishima et al. | 250/208.1 |
| 2014/0211057 A1* | 7/2014 | Chien | H04N 5/361 348/308 |
| 2014/0340555 A1 | 11/2014 | Iwane et al. | 348/308 |
| 2015/0341580 A1 | 11/2015 | Yamazaki et al. | H04N 5/37457 |
| 2016/0057372 A1 | 2/2016 | Iwane et al. | H01L 27/14609 |
| 2016/0071896 A1 | 3/2016 | Kawabata et al. | H01L 27/14621 |
| 2016/0071902 A1 | 3/2016 | Okita et al. | H01L 27/14625 |
| 2016/0073016 A1 | 3/2016 | Ohya et al. | H04N 5/3696 |
| 2016/0133663 A1 | 5/2016 | Minowa et al. | H01L 27/1464 |
| 2016/0218127 A1 | 7/2016 | Kato et al. | H01L 27/14643 |

(56) References Cited

U.S. PATENT DOCUMENTS

| | | | |
|---|---|---|---|
| 2017/0092677 A1 | 3/2017 | Ikakura et al. | ... H01L 27/14685 |
| 2017/0133417 A1 | 5/2017 | Hiyama et al. | ... H01L 27/14645 |
| 2017/0180628 A1 | 6/2017 | Kato | ... H04N 5/23254 |

FOREIGN PATENT DOCUMENTS

| | | | | |
|---|---|---|---|---|
| JP | 2012-164945 | | 8/2012 | |
| JP | 2012164944 A | * | 8/2012 | ....... H01L 27/14623 |
| JP | 2012164945 A | * | 8/2012 | ....... H01L 27/14685 |
| JP | 2009-164247 | | 8/2013 | |
| JP | 2016-4885 | | 4/2016 | |
| KR | 10-2012-0002786 | | 1/2012 | |
| WO | 2015/198908 | | 12/2015 | |

OTHER PUBLICATIONS

Great Britain Combined Search and Examination Report dated May 21, 2018 during prosecution of related Great Britain application No. GB1710511.5.

Japanese Office Action dated May 21, 2018 during prosecution of Japanese application No. 2017-078633. (An English-language machine translation is included).

* cited by examiner

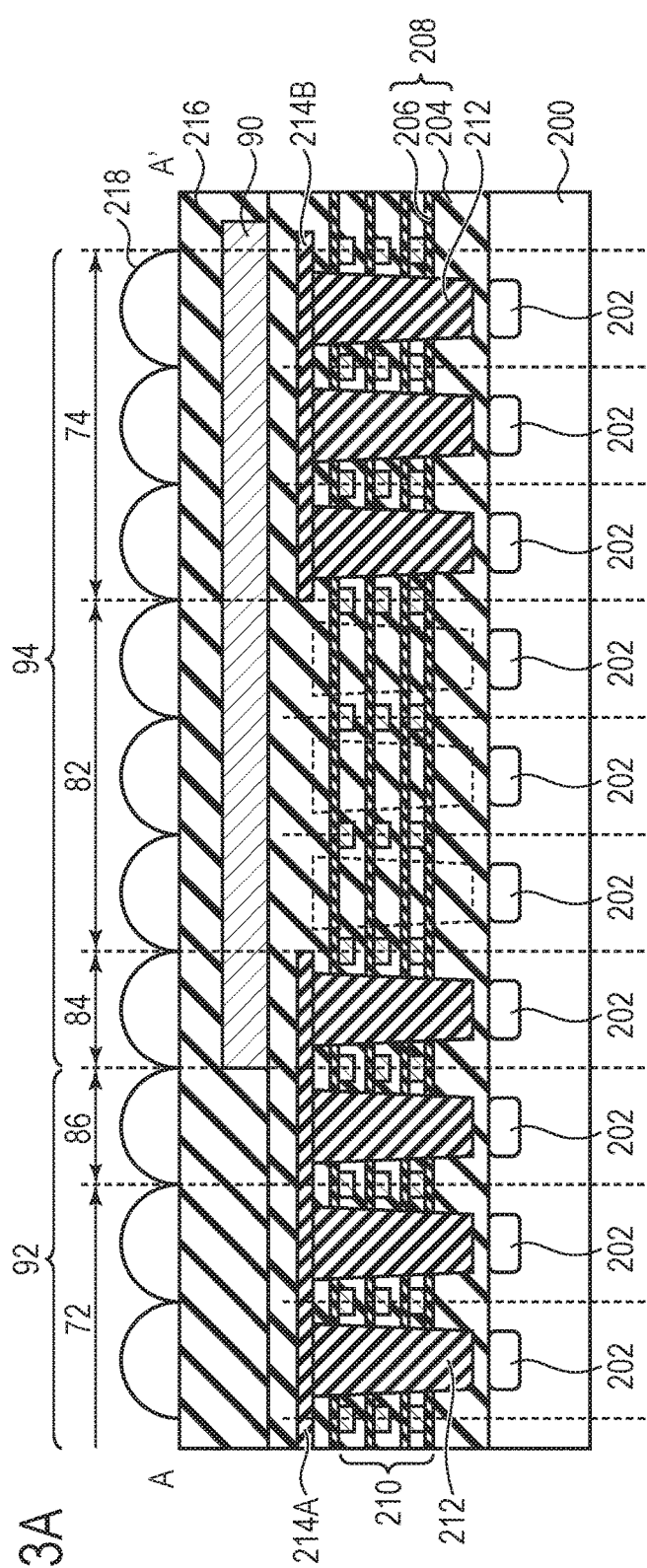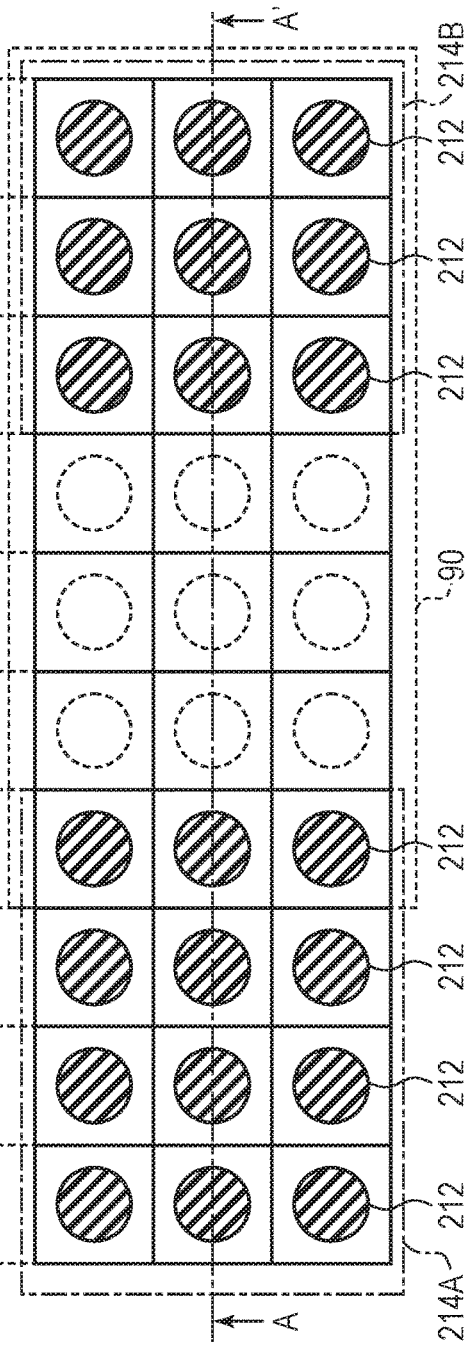
FIG. 3A
FIG. 3B

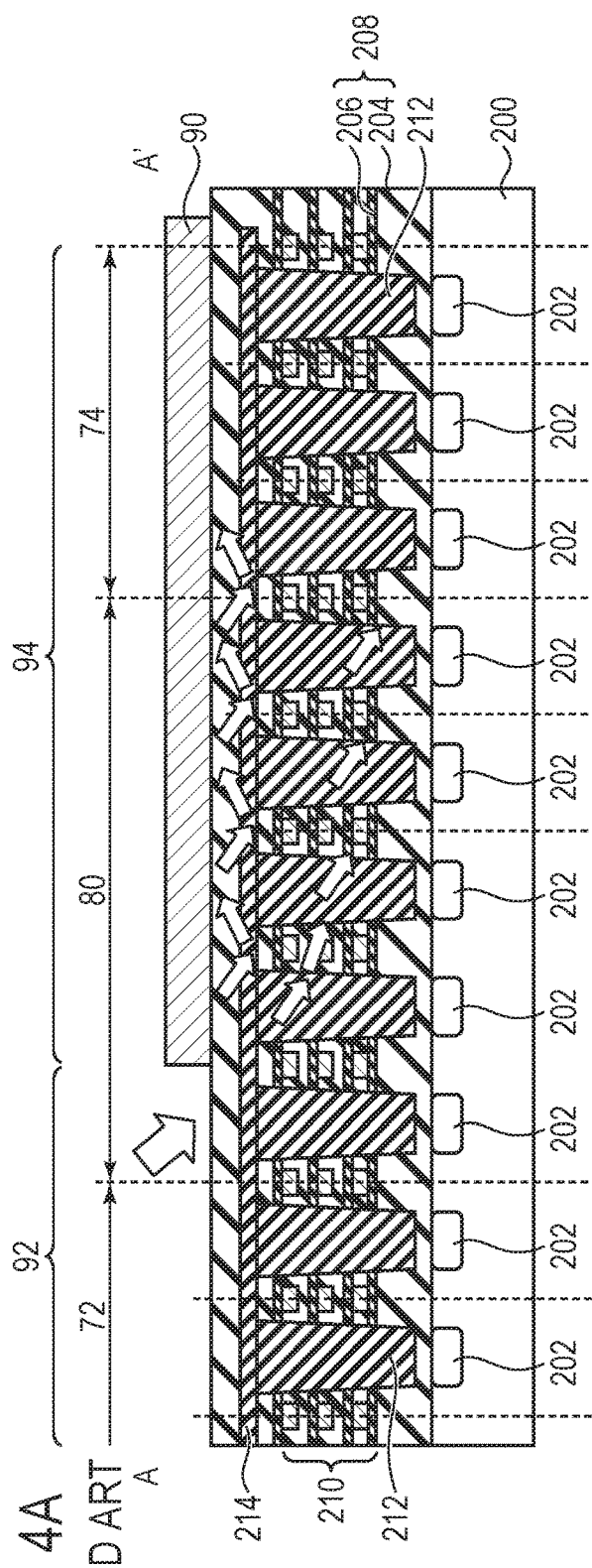
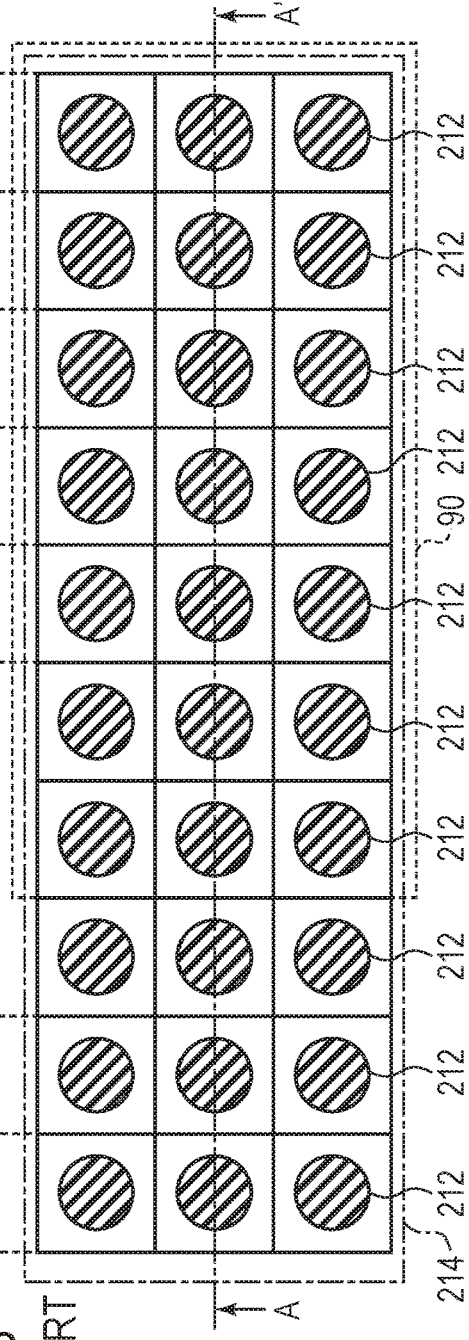
FIG. 4A RELATED ART
FIG. 4B RELATED ART

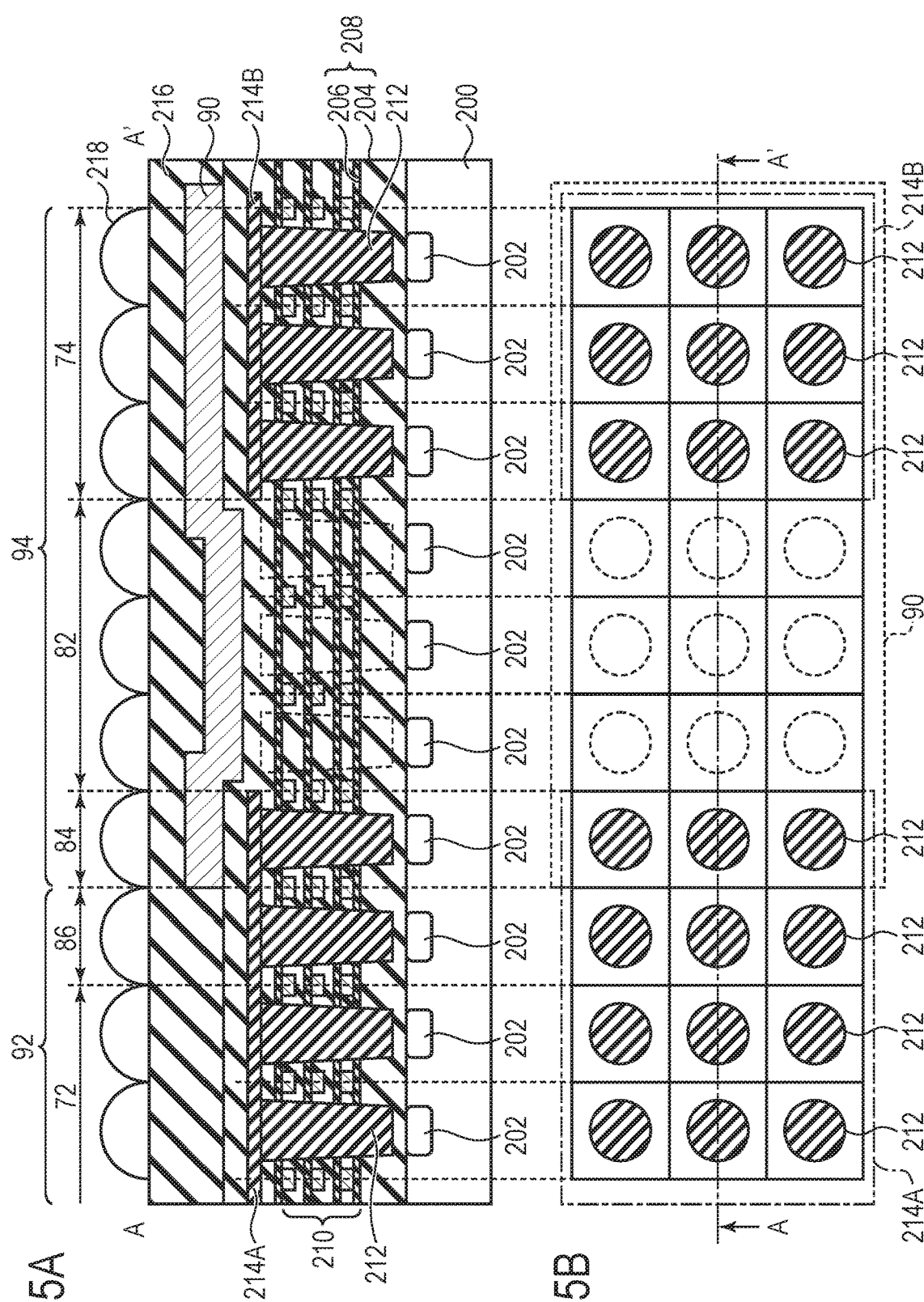

IMAGING DEVICE HAVING AN EFFECTIVE PIXEL REGION, AN OPTICAL BLACK REGION AND A DUMMY REGION EACH WITH PIXELS INCLUDING A PHOTOELECTRIC CONVERTER

BACKGROUND OF THE INVENTION

Field of the Invention

The present invention relates to an imaging device including an optical waveguide provided above a photoelectric converter.

Description of the Related Art

In recent years, a video camera, an electronic still camera, and other such imaging system have become generally widespread. A CCD, a CMOS image sensor, and other such imaging device are used for those cameras. As a technology for improving sensitivity of those imaging devices, it is proposed to provide an optical waveguide above a light-receiving surface of a photoelectric converter of each pixel. In Japanese Patent Application Laid-Open No. 2009-164247, there is disclosed a solid-state imaging device including optical waveguides arranged above photoelectric conversion elements.

The imaging device includes an effective pixel region in which pixels for outputting a signal of an image are arranged, and also includes an optical black (OB) region in which pixels for outputting a reference signal to be used as a reference for a black level are arranged. In order to acquire a better-quality image, it is important to reduce a difference in output of a dark signal between the pixels arranged in the effective pixel region and the pixels arranged in the OB region.

SUMMARY OF THE INVENTION

An object of the present invention is to provide an imaging device capable of reducing a difference in output of a dark signal between pixels arranged in an effective pixel region and pixels arranged in an OB region, to thereby acquire a better-quality image.

According to one aspect of the present invention, there is provided an imaging device including a pixel region in which a plurality of pixels, each including a photoelectric converter, are arranged, including an effective pixel region, an optical black region covered with a light-shielding film, and a dummy pixel region arranged between the effective pixel region and the optical black region, wherein the pixels arranged in at least the effective pixel region and the optical black region among the plurality of the pixels each include an optical waveguide arranged above the photoelectric converter, and wherein the pixels including the optical waveguide are arranged between the effective pixel region and the optical black region so as to be spaced apart from each other by at least a one-pixel pitch.

Further, according to another aspect of the present invention, there is provided an imaging device including a pixel region in which a plurality of pixels, each including a photoelectric converter and an optical waveguide arranged above the photoelectric converter, are arranged, including an effective pixel region including the pixels configured to output a signal that is based on a charge generated through photoelectric conversion by the photoelectric converter, an optical black region, which includes the pixels, and is covered with a light-shielding film, and a dummy pixel region arranged between the effective pixel region and the optical black region, a first connecting portion, which is made of a material having a same characteristic as a characteristic of the optical waveguide, provided so as to connect the optical waveguides of the pixels provided in the effective pixel region to each other, and a second connecting portion, which is made of the material having the same characteristic as the characteristic of the optical waveguide, provided so as to connect the optical waveguides of the pixels provided in the optical black region to each other, wherein the first connecting portion and the second connecting portion being are arranged so as to be spaced apart from each other.

According to a further aspect of the present invention there is provided an imaging device according to claim 1.

Further features of the present invention will become apparent from the following description of exemplary embodiments with reference to the attached drawings.

BRIEF DESCRIPTION OF THE DRAWINGS

FIG. 3A and FIG. 3B are a cross-sectional view and a top view for illustrating a structure of the imaging device according to the first embodiment of the present invention.

FIG. 4A and FIG. 4B are a cross-sectional view and a top view for illustrating a structure of an imaging device according to a comparative example of the present invention.

FIG. 5A and FIG. 5B are a cross-sectional view and a top view for illustrating a structure of an imaging device according to a second embodiment of the present invention.

DESCRIPTION OF THE EMBODIMENTS

Now, an imaging device according to each of embodiments of the present invention is described with reference to the attached drawings. Technologies well known or publicly known in the technical field of the present invention are applied to portions that are not particularly illustrated or described herein. The following embodiments are merely exemplary embodiments of the present invention. Therefore, the present invention is not limited to the following embodiments.

In each of the following embodiments, there is provided an imaging device capable of reducing a difference in output of a dark signal between pixels arranged in an effective pixel region and pixels arranged in an OB region, to thereby acquire a better-quality image. As described above, in order to acquire the better-quality image, it is important to reduce the difference in output of the dark signal between the pixels arranged in the effective pixel region and the pixels arranged in the OB region. However, particularly in a case of a structure including an optical waveguide above a photoelectric converter, light leakage to an OB pixel is liable to increase, and the image quality is liable to deteriorate.

[First Embodiment]

Figure 1:
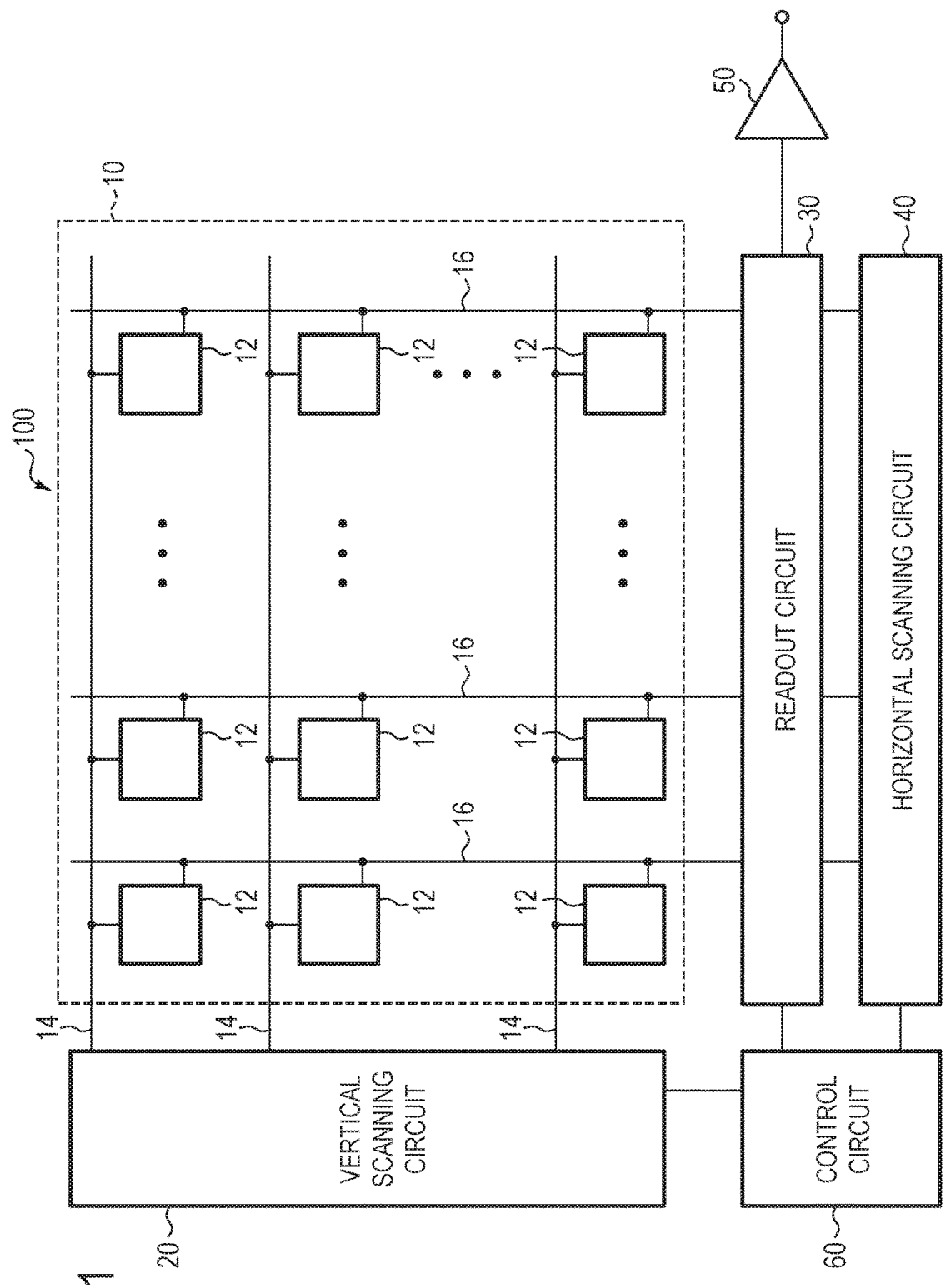
FIG. 1 is a block diagram for illustrating a schematic configuration of an imaging device according to a first embodiment of the present invention.
Figure 2A:
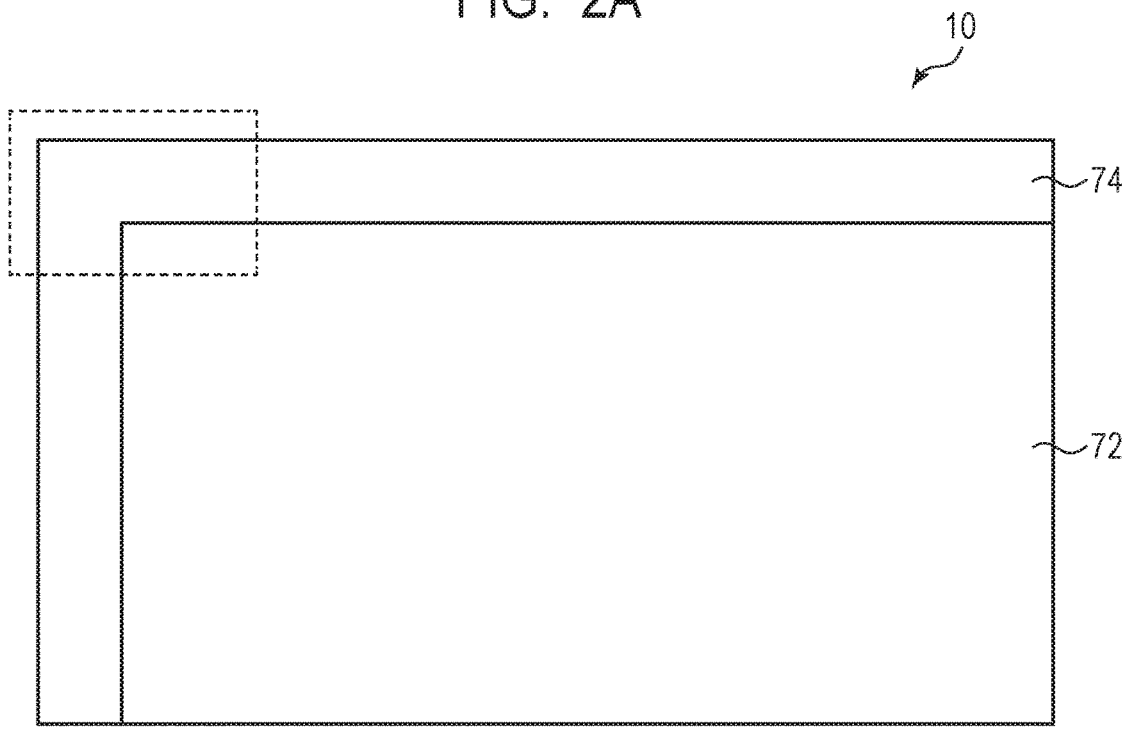
FIG. 2A and FIG. 2B are plan views for illustrating a layout of a pixel region of the imaging device according to the first embodiment of the present invention.
Figure 2B:
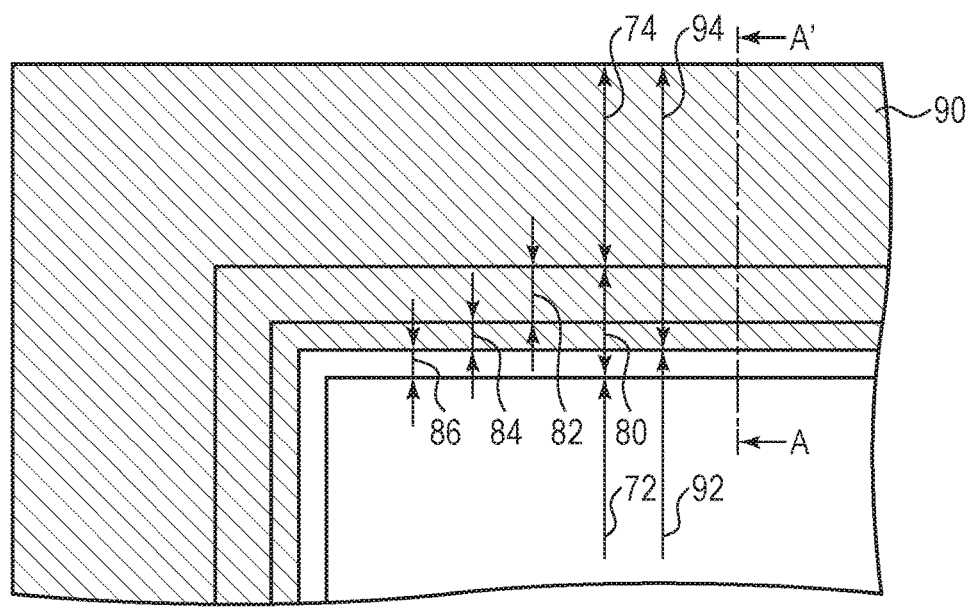

An imaging device according to a first embodiment of the present invention is described with reference to FIG. 1 to FIG. 4B. FIG. 1 is a block diagram for illustrating a schematic configuration of an imaging device according to the present embodiment. FIG. 2A and FIG. 2B are plan views for illustrating a layout of a pixel region of the imaging device according to the present embodiment. FIG. 3A and FIG. 3B are a cross-sectional view and a top view for illustrating a structure of the imaging device according to the present embodiment. FIG. 4A and FIG. 4B are a cross-sectional view and a top view for illustrating a structure of an imaging device according to a comparative example of the present invention.

As illustrated in FIG. 1, an imaging device 100 according to the present embodiment includes a pixel region 10, a vertical scanning circuit 20, a readout circuit 30, a horizontal scanning circuit 40, an output amplifier 50, and a control circuit 60.

In the pixel region 10, a plurality of pixels 12 are regularly arranged in a two-dimensional shape (matrix shape) over a plurality of rows and a plurality of columns. The pixels 12 each include a photoelectric converter configured to generate a charge by photoelectric conversion and an in-pixel readout circuit configured to output a signal corresponding to an amount of the charge generated by the photoelectric converter.

The vertical scanning circuit 20 is a circuit unit configured to supply the pixel 12 with control signals for driving the in-pixel readout circuit to read a signal from the pixel 12 through control signal lines 14 provided to each row of a pixel array. The signal read from the pixel 12 is input to the readout circuit 30 through a vertical output line 16 provided to each column of the pixel array.

The readout circuit 30 is a circuit unit configured to conduct predetermined signal processing, for example, amplification processing or addition processing, on the signal read from the pixel 12. The readout circuit 30 may include, for example, a column amplifier, a correlated double sampling (CDS) circuit, or an adder circuit. The readout circuit 30 may further include an A/D converter circuit.

The horizontal scanning circuit 40 is a circuit unit configured to supply the readout circuit 30 with a signal for transferring the signal processed by the readout circuit 30 to the output amplifier 50 in order for each column. The output amplifier 50 is a circuit unit formed of a buffer amplifier or a differential amplifier and is configured to amplify and output the signal from the column, which is selected by the horizontal scanning circuit 40.

The control circuit 60 is a circuit unit configured to supply the vertical scanning circuit 20, the readout circuit 30, and the horizontal scanning circuit 40 with control signals for controlling their operations and timings. The control circuit 60 may be omitted from the imaging device 100, and the control signals to be supplied to the vertical scanning circuit 20, the readout circuit 30, and the horizontal scanning circuit 40 may be supplied from outside the imaging device 100.

The above-mentioned configuration is merely an example of the configuration of the imaging device 100 to which the present invention can be applied, and the configuration of the imaging device to which the present invention can be applied is not limited thereto.

As illustrated in FIG. 2A, the pixel region 10 includes an effective pixel region 72 in which the pixels 12 for outputting an image signal are arranged and an optical black region (OB region) 74 in which the pixels 12 for outputting a reference signal to be used as a reference for a black level are arranged. There is no particular limitation imposed on the OB region 74. For example, as illustrated in FIG. 2A, the OB region 74 is arranged along two peripheral sides of the pixel region 10.

FIG. 2B is an enlarged view of a part of FIG. 2A which is surrounded by the dotted line. A dummy pixel region 80 is arranged between the effective pixel region 72 and the OB region 74. The dummy pixel region 80 is a region in which the pixels 12 that are not involved in the reading of the signal are arranged. Those pixels 12 each include the photoelectric converter and the in-pixel readout circuit in the same manner as the pixels 12 provided to the effective pixel region 72 and the OB region 74. The dummy pixel region 80 is provided in order to suppress light leakage to the OB region 74 and variations of pixel characteristics ascribable to structural discontinuity between the effective pixel region 72 and the OB region 74 (for example, between presence and absence of a light-shielding film 90). In the present embodiment, for the sake of convenience of description, a first region 82, a second region 84, and a third region 86 are defined within the dummy pixel region 80 in order from the OB region 74 side toward the effective pixel region 72 side.

The first region 82 and the second region 84 of the dummy pixel region 80 and the OB region 74 are covered with the light-shielding film 90. The light-shielding film 90 is not provided to the third region 86 of the dummy pixel region 80 or the effective pixel region 72. Herein, a region that is not covered with the light-shielding film 90 is sometimes referred to also as "opening region 92," and a region covered with the light-shielding film 90 is sometimes referred to also as "light-shielding region 94."

FIG. 3A is a cross-sectional view of the vicinity of the boundary between the opening region 92 and the light-shielding region 94, and corresponds to the cross-sectional view taken along the line A-A' of FIG. 2B. FIG. 3A is an illustration of an example in which two, one, one, three, and three pixels 12 are arranged in the effective pixel region 72, the third region 86, the second region 84, the first region 82, and the OB region 74, respectively, along the line A-A'. The numbers of pixels 12 arranged in the respective regions are not limited to the above-mentioned numbers. FIG. 3B is a top view of three columns of pixels including the pixels 12 adjacent to each other in a direction intersecting the line A-A' of FIG. 2B.

The imaging device 100 includes a semiconductor substrate 200. The semiconductor substrate 200 includes a photoelectric converter 202 and various transistors (not illustrated) forming the in-pixel readout circuit, which are provided on a surface portion of the semiconductor substrate 200 in association with an arrangement place of each pixel 12. For example, 10×3 rectangular regions illustrated in FIG. 3B correspond to the arrangement places of the pixels 12.

An insulating film 208 in which an interconnection layers 210 are embedded is provided on the semiconductor substrate 200. The interconnection layers 210 include interconnections for connecting respective elements of the pixels 12 to each other, control signal lines for supplying the control signals to the pixels 12, power supply lines for supplying power and a reference voltage to the pixels 12, output lines of the pixel signals, and a light-shielding film. FIG. 3A is an illustration of an example in which the interconnection layers 210 of a three-layer structure is provided to the insulating film 208, but there is no particular limitation imposed on the number of the interconnection layers 210.

There is no particular limitation imposed on the insulating film 208. For example, the insulating film 208 is formed of a stacked film obtained by alternately depositing a first film 204 made of silicon oxide ($SiO_2$) or the like and a second film 206 made of silicon carbide (SiC) or the like. The first film 204 is a main part forming the insulating film 208, and is generally formed of an insulating material having a low dielectric constant. The second film 206 is an etching stopper film or a film used as a diffusion prevention film against a material forming the interconnection layers 210, and is typically formed of a material having a refractive index higher than that of the material forming the first film 204. For example, the first film 204 has a refractive index of about 1.46 when made of $SiO_2$, while the second film 206 has a refractive index of about 1.76 when made of SiC. There is also no particular limitation imposed on the interconnection layers 210. For example, the interconnection layers 210 are formed of aluminum (Al), copper (Cu), or tungsten (W).

The insulating film 208 on the photoelectric converters 202 of the pixels 12 arranged in the second region 84 and the third region 86 of the dummy pixel region 80, the effective pixel region 72, and the OB region 74 includes optical waveguides 212 in association with the pixels 12 on a one-to-one basis. The optical waveguide 212 is made of a material, for example, silicon nitride (SiN), having a refractive index higher than at least that of the material forming the first film 204 of the insulating film 208. The refractive index of SiN is from about 1.8 to about 2.0. The optical waveguide 212 is not provided above any one of the photoelectric converters 202 of the pixels 12 arranged in the first region 82 of the dummy pixel region 80.

The optical waveguides 212 provided above the photoelectric converters 202 of the pixels 12 arranged in the second region 84 and the third region 86 of the dummy pixel region 80 and the effective pixel region 72 are connected to each other by a connecting portion 214A provided thereon. Meanwhile, the optical waveguides 212 provided above the photoelectric converters 202 of the pixels 12 arranged in the OB region 74 are connected to each other by a connecting portion 214B provided thereon. The connecting portion 214A and the connecting portion 214B are spaced apart from each other without being provided in the first region 82 of the dummy pixel region 80. The connecting portion 214A and the connecting portion 214B are made of a material, for example, silicon nitride, having the same characteristic as that of the material forming the optical waveguide 212.

The light-shielding film 90 is provided on the insulating film 208. The light-shielding film 90 is arranged in the light-shielding region 94. An insulating film 216 is provided on the insulating film 208 provided with the light-shielding film 90. The insulating film 216 may include a color filter (not illustrated). The color filter is configured to select a wavelength of light entering the photoelectric converter 202 of each pixel 12. Microlenses 218 each configured to condense light on the photoelectric converter 202 are provided on the insulating film 216 in association with the pixels 12 on a one-to-one basis. The pixels 12 arranged in the light-shielding region 94 do not need to be provided with the microlens 218.

In this manner, in the imaging device 100 according to the present embodiment, the optical waveguides 212, the connecting portion 214A, and the connecting portion 214B are not provided to any one of the pixels 12 arranged in the first region 82 of the dummy pixel region 80. In other words, the pixels 12 including the optical waveguides 212 are arranged so as to be spaced apart from each other by at least a one-pixel pitch between the effective pixel region 72 and the OB region 74. In addition, the connecting portion 214A for connecting the optical waveguides 212 of the pixels arranged in the effective pixel region 72 and the connecting portion 214B for connecting the optical waveguides 212 of the pixels 12 arranged in the OB region 74 are discontinuous in the first region 82 of the dummy pixel region 80.

The reason that the imaging device 100 according to the present embodiment has such a configuration is described below in comparison with an imaging device according to a comparative example of the present invention.

As illustrated in, for example, FIG. 4A and FIG. 4B, the imaging device according to the comparative example is configured such that every pixel 12 arranged in the opening region 92 and the light-shielding region 94 is provided with the optical waveguide 212 and a connecting portion 214. In another case, although not illustrated herein, the imaging device is configured such that no pixel arranged in the light-shielding region 94 is provided with the optical waveguide.

In the case of such a configuration as illustrated in FIG. 4A, when strong light (indicated by the arrow in FIG. 4A) enters the opening region 92 near the light-shielding region 94, the light also enters the pixel 12 under the light-shielding film 90 via the optical waveguide 212 in the opening region 92 and the connecting portion 214. The light has a property of propagating through a region having a high refractive index, and hence the entering light propagates through the optical waveguide 212 and the connecting portion 214 that have a high refractive index. In addition, the optical waveguide 212 has a property of enclosing light, but when light having a wide angle of incidence enters the optical waveguide 212 as illustrated in FIG. 4A, a part of the light leaks from a side wall of the optical waveguide 212, and the leaking light enters the adjacent pixel 12. In the case of such a configuration as illustrated in FIG. 4A in which a plurality of optical waveguides 212 are arranged and connected to each other by the connecting portion 214, the light is successively transmitted to the adjacent pixels via the connecting portion 214 and the optical waveguide 212. When strong light enters, for example, when the sun is photographed, a part of the light that leaks from the side wall of the optical waveguide 212 may reach the OB region 74. When the light reaches the OB region 74, the level of the signal to be used as the reference for the black level deviates, and the image deteriorates.

From the viewpoint of suppressing the light propagating to the OB region 74 via the optical waveguides 212 and the connecting portion 214 of the pixels 12 in the light-shielding region 94, it is conceivable not to provide the optical waveguides 212 or the connecting portion 214 to the pixels 12 in the light-shielding region 94. With this configuration, it is possible to suppress an amount of light that enters the OB region 74 to a level lower than with the configuration in which the optical waveguides 212 and the connecting portion 214 are provided to the pixels 12 in the light-shielding region 94. However, such a configuration raises a new problem described below.

It is known that the pixel 12 provided with the optical waveguide 212 and the pixel 12 that is not provided with the optical waveguide 212 differ from each other in noise level when those pixels 12 are compared in terms of noise. For example, when the optical waveguide 212 is formed of silicon nitride, plasma silicon nitride containing hydrogen is formed and then subjected to annealing treatment under a hydrogen atmosphere, to thereby promote supply of hydrogen into a photodiode, which can reduce the noise in the pixel 12. When the pixel 12 in the OB region 74 is not provided with the optical waveguide 212, the above-mentioned noise reduction effect cannot be obtained, which causes a difference in noise between the pixel 12 in the OB region 74 and the pixel 12 in the effective pixel region 72 which includes the optical waveguide 212. As a result, between the pixels 12 arranged in the effective pixel region 72 and the pixels 12 arranged in the OB region 74, the signal to be used as the reference for the black level deviates, and the image deteriorates in turn.

In this respect, the imaging device according to the present embodiment is configured such that both the pixels 12 in the effective pixel region 72 and the OB region include the optical waveguides 212, which causes no difference in noise due to presence or absence of the optical waveguide 212. The signal of the pixel 12 arranged in the dummy pixel region 80 is not used, and hence there occurs no problem even when the pixel 12 arranged in the dummy pixel region 80 differs from the pixel 12 arranged in the effective pixel region 72 in terms of noise. The imaging device according to the present embodiment is further configured such that the optical waveguides 212 and the connecting portion 214 are not provided in the first region 82 of the dummy pixel region 80, which can suppress the entering of light from the connecting portion 214 and the side wall of the optical waveguide 212. The effect of suppressing the entering of light can be obtained by arranging the pixels 12 including the optical waveguides 212 so as to be spaced apart from each other by at least a one-pixel pitch.

The second region 84 and the third region 86 of the dummy pixel region 80 are mainly provided in order to suppress the influence of a difference in level which occurs due to the light-shielding film 90. In a boundary portion between the second region 84 and the third region 86, it is difficult to completely eliminate the difference in level which occurs due to the light-shielding film 90, and a structure formed in a further upper layer may have flatness lowered so as to reflect the difference in level. As a result, in the pixels 12 arranged in the third region 86, the color filter, the microlens 218, or the like is arranged on an underlying portion that is not flat, which causes a fear of degrading optical characteristics. The pixel 12 arranged in the third region 86 is set as a dummy pixel so as not to be used as the pixel 12 for outputting the signal of the image, to thereby be able to suppress the influence on the image. When the difference in level of the light-shielding film 90 can be sufficiently alleviated or when the influence of the difference in level of the light-shielding film 90 on the image can be ignored, one or both of the second region 84 and the third region 86 of the dummy pixel region 80 are not necessarily provided.

In this manner, according to the present embodiment, it is possible to suppress the leakage of light to the OB region 74 and to eliminate the difference in output of the dark signal between the effective pixel region 72 and the OB region 74, and hence a good-quality image can be acquired with stability.

[Second Embodiment]

An imaging device according to a second embodiment of the present invention is described with reference to FIG. 5A and FIG. 5B. The same components as those of the imaging device according to the first embodiment illustrated in FIG. to FIG. 3B are denoted by like reference symbols, and descriptions thereof are omitted or simplified.

FIG. 5A and FIG. 5B are a cross-sectional view and a top view for illustrating a structure of the imaging device according to the present embodiment. FIG. 5A is a cross-sectional view of the vicinity of the boundary between the opening region 92 and the light-shielding region 94, and corresponds to the cross-sectional view taken along the line A-A' of FIG. 2B. FIG. 5B is a top view of three columns of pixels 12 including the pixels 12 adjacent to each other in the direction intersecting the line A-A' of FIG. 2B.

As illustrated in FIG. 5A, the imaging device according to the present embodiment is the same as the imaging device according to the first embodiment except that the light-shielding film 90 in the first region 82 of the dummy pixel region 80 has a different configuration.

That is, in the imaging device according to the present embodiment, an interval between the photoelectric converter 202 and the light-shielding film 90 in the first region 82 of the dummy pixel region 80 is smaller than an interval between the photoelectric converter 202 and the light-shielding film 90 in any other region. A stepped portion is formed in the light-shielding film 90 between the first region 82 and the second region 84 of the dummy pixel region 80. In the case of the configuration in which the optical waveguides 212 and the connecting portion 214 are not provided in the first region 82 of the dummy pixel region 80, it is possible to easily reduce the interval between the photoelectric converter 202 and the light-shielding film 90 in the first region 82.

With such a configuration, the light propagating through the connecting portion 214A of the second region 84 is blocked by the stepped portion of the light-shielding film 90 formed in a boundary portion between the first region 82 and the second region 84. As a result, it is possible to suppress the light propagating toward the OB region 74 to a level much lower than with the imaging device according to the first embodiment.

In this manner, according to the present embodiment, it is possible to suppress the leakage of light to the OB region 74 and to eliminate the difference in output of the dark signal between the effective pixel region 72 and the OB region 74, and hence a good-quality image can be acquired with stability.

[Third Embodiment]

An imaging device according to a third embodiment of the present invention is described with reference to FIG. 6 to FIG. 7B. The same components as those of the imaging devices according to the first and second embodiments illustrated in FIG. 1 to FIG. 5B are denoted by like reference symbols, and descriptions thereof are omitted or simplified.

Figure 6:
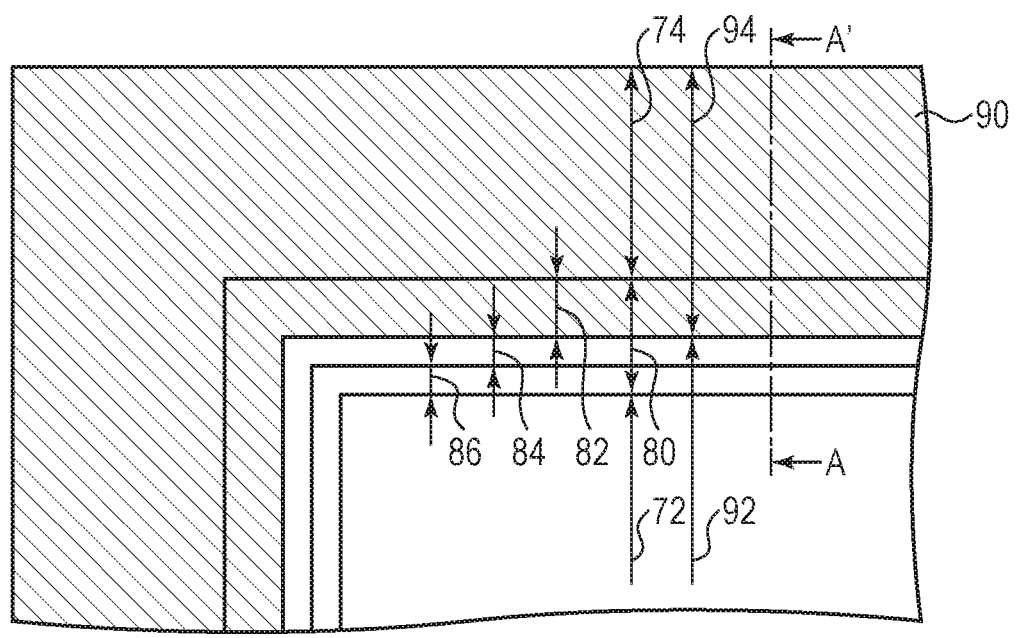
FIG. 6 is a plan view for illustrating a layout of a pixel region of an imaging device according to a third embodiment of the present invention.
Figure 7:
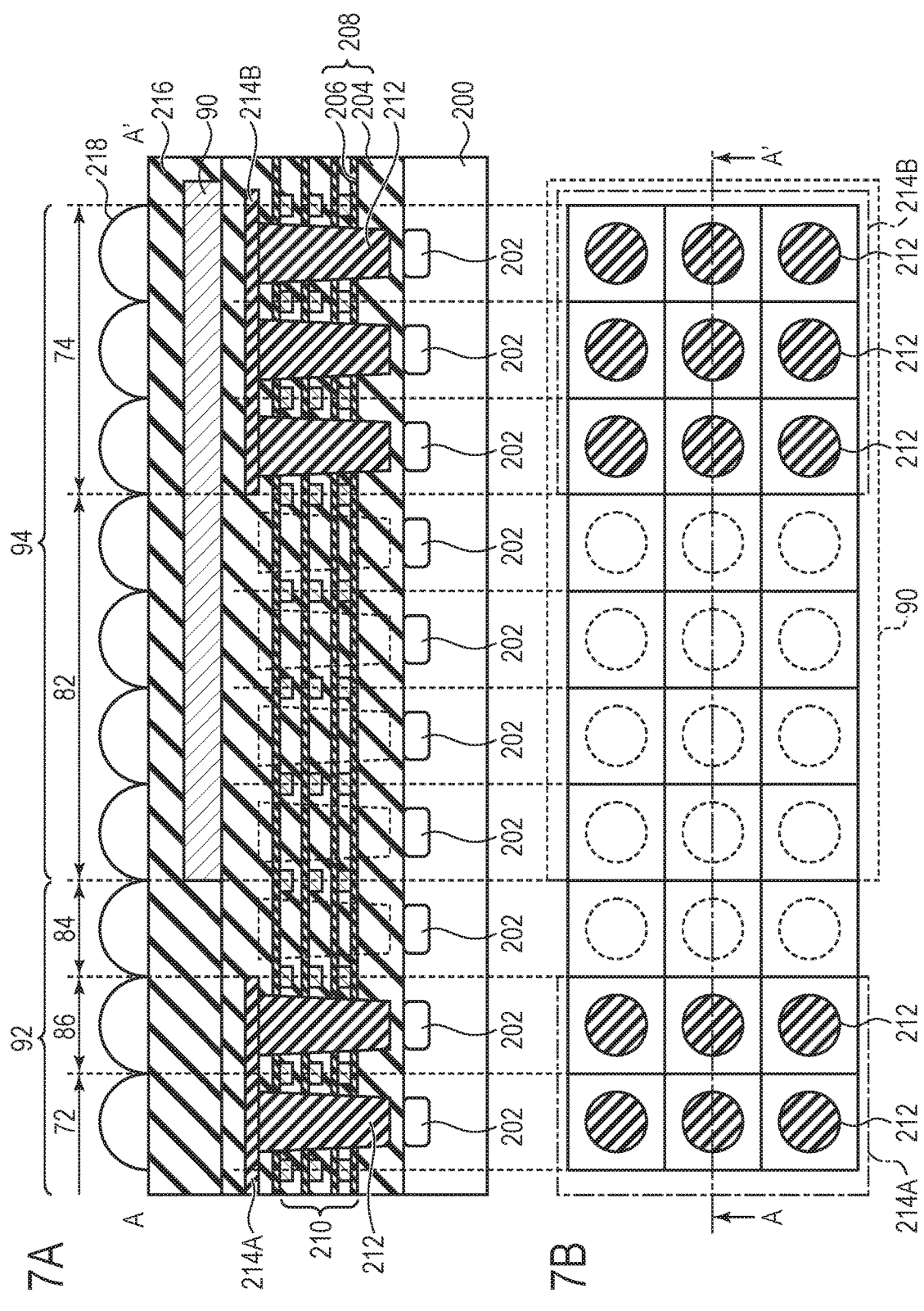
FIG. 7A and FIG. 7B are a cross-sectional view and a top view for illustrating a structure of the imaging device according to the third embodiment of the present invention.

FIG. 6 is a plan view for illustrating a layout of pixel regions of an imaging device according to the present embodiment. FIG. 7A and FIG. 7B are a cross-sectional view and a top view for illustrating a structure of the imaging device according to the present embodiment.

FIG. 6 is an enlarged view of a part of FIG. 2A which is surrounded by the dotted line. The dummy pixel region 80 is arranged between the effective pixel region 72 and the OB region 74. Also in the present embodiment, for the sake of convenience of description, the first region 82, the second region 84, and the third region 86 are defined within the dummy pixel region 80 in order from the OB region 74 side toward the effective pixel region 72 side.

In the imaging device according to the present embodiment, the OB region 74 and the first region 82 of the dummy pixel region 80 are covered with the light-shielding film 90. The light-shielding film 90 is not provided to the second region 84 or the third region 86 of the dummy pixel region 80 or the effective pixel region 72.

FIG. 7A is a cross-sectional view of the vicinity of the boundary between the opening region 92 and the light-shielding region 94, and corresponds to the cross-sectional view taken along the line A-A' of FIG. 6. FIG. 7B is a top view of three columns of pixels 12 including the pixels 12 adjacent to each other in a direction intersecting the line A-A' of FIG. 6.

The insulating film 208 on the photoelectric converters 202 of the pixels 12 arranged in the third region 86 of the dummy pixel region 80, the effective pixel region 72, and the OB region 74 includes the optical waveguides 212 in association with the pixels 12 on a one-to-one basis.

The optical waveguides 212 provided above the photoelectric converters 202 of the pixels 12 arranged in the effective pixel region 72 and the third region 86 of the dummy pixel region 80 are connected to each other by the connecting portion 214A. Meanwhile, the optical waveguides 212 provided above the photoelectric converters 202 of the pixels 12 arranged in the OB region 74 are connected to each other by the connecting portion 214B. The connecting portion 214A and the connecting portion 214B are spaced apart from each other without being provided in the first region 82 or the second region 84 of the dummy pixel region 80.

That is, the imaging device according to the present embodiment is different from the imaging device according to the first embodiment in that the second region 84 of the dummy pixel region 80 is arranged in the opening region 92 and that the optical waveguides 212 and the connecting portion 214 are not provided in the second region 84 of the dummy pixel region 80.

In the imaging device according to the present embodiment, the optical waveguides 212 and the connecting portion 214 are not provided to any one of the pixels 12 in the first region 82 and the second region 84 of the dummy pixel region 80. In other words, the pixels 12 including the optical waveguide 212 are arranged so as to be spaced apart from each other by at least a one-pixel pitch between the effective pixel region 72 and the OB region 74. In addition, the connecting portion 214A for connecting the optical waveguides 212 of the pixels 12 arranged in the effective pixel region 72 and the connecting portion 214B for connecting the optical waveguides 212 of the pixels 12 arranged in the OB region 74 are discontinuous in the first region 82 and the second region 84 of the dummy pixel region 80.

Therefore, even in the imaging device according to the present embodiment, it is possible to suppress the leakage of light to the OB region 74 and to eliminate the difference in output of the dark signal between the effective pixel region 72 and the OB region 74, and hence a good-quality image can be acquired with stability.

[Fourth Embodiment]

Figure 8:
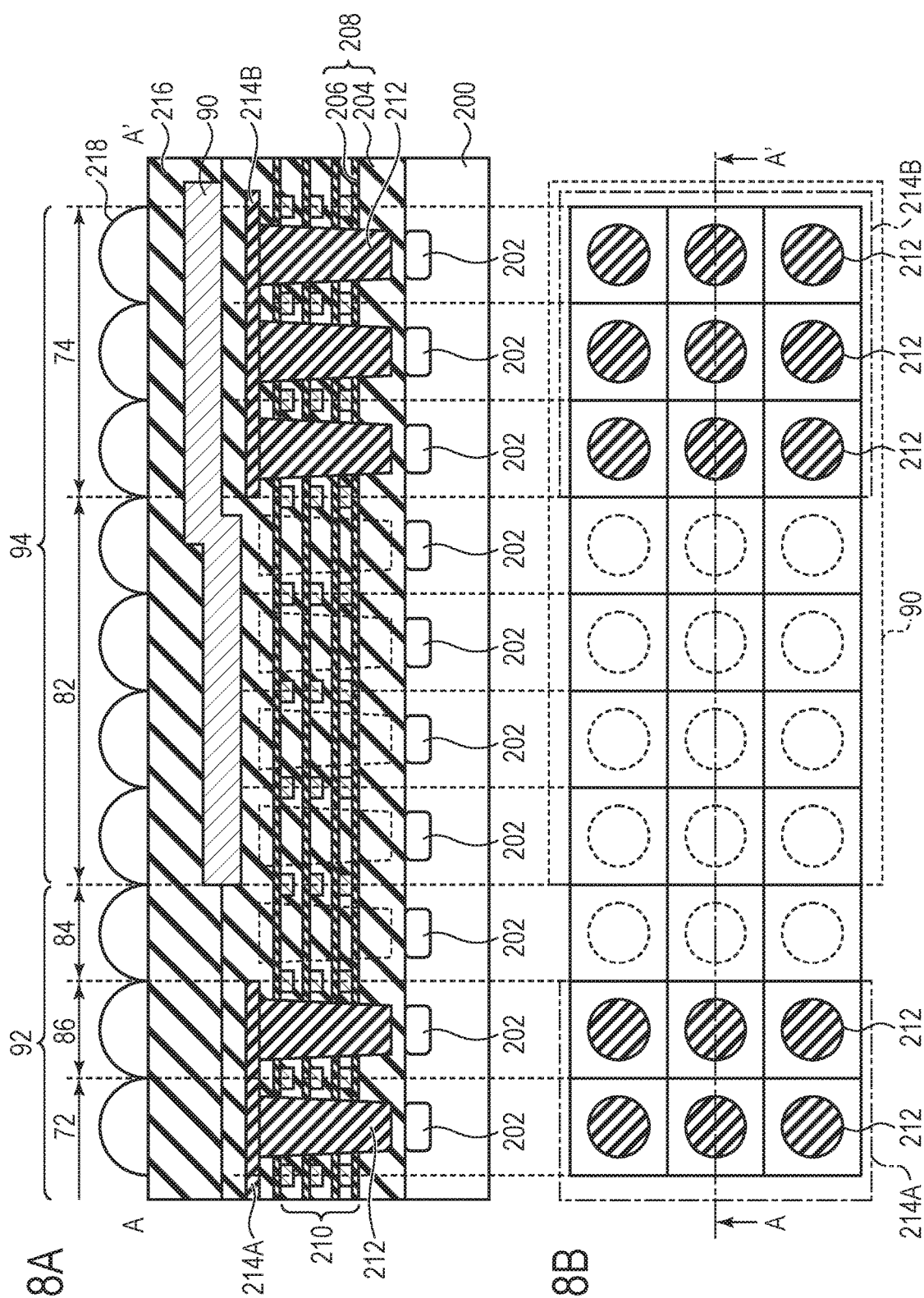
FIG. 8A and FIG. 8B are a cross-sectional view and a top view for illustrating a structure of an imaging device according to a fourth embodiment of the present invention.

An imaging device according to a fourth embodiment of the present invention is described with reference to FIG. 8A and FIG. 8B. The same components as those of the imaging devices according to the first to third embodiments illustrated in FIG. 1 to FIG. 7B are denoted by like reference symbols, and descriptions thereof are omitted or simplified.

FIG. 8A and FIG. 8B are a cross-sectional view and a top view for illustrating a structure of the imaging device according to the present embodiment. FIG. 8A is a cross-sectional view of the vicinity of the boundary between the opening region 92 and the light-shielding region 94, and corresponds to the cross-sectional view taken along the line A-A' of FIG. 6. FIG. 8B is a top view of three columns of pixels 12 including the pixels 12 adjacent to each other in the direction intersecting the line A-A' of FIG. 6.

As illustrated in FIG. 8A, the imaging device according to the present embodiment is the same as the imaging device according to the third embodiment except that the light-shielding film 90 in the first region 82 of the dummy pixel region 80 has a different configuration.

That is, in the imaging device according to the present embodiment, an interval between the photoelectric converter 202 and the light-shielding film 90 in the first region 82 of the dummy pixel region 80 is smaller than an interval between the photoelectric converter 202 and the light-shielding film 90 in any other region. In the case of the configuration in which the optical waveguides 212 and the connecting portion 214 are not provided in the first region 82 and the second region 84 of the dummy pixel region 80, it is possible to easily reduce the interval between the photoelectric converter 202 and the light-shielding film 90 in the first region 82.

With such a configuration, the light propagating through the connecting portion 214A of the third region 86 is blocked by an end portion of the light-shielding film 90 formed in a boundary portion between the first region 82 and the second region 84. As a result, it is possible to suppress the light propagating toward the OB region 74 to a level much lower than with the imaging device according to the third embodiment.

In this manner, according to the present embodiment, it is possible to suppress the leakage of light to the OB region 74 and to eliminate the difference in output of the dark signal between the effective pixel region 72 and the OB region 74, and hence a good-quality image can be acquired with stability.

[Fifth Embodiment]

Figure 9:
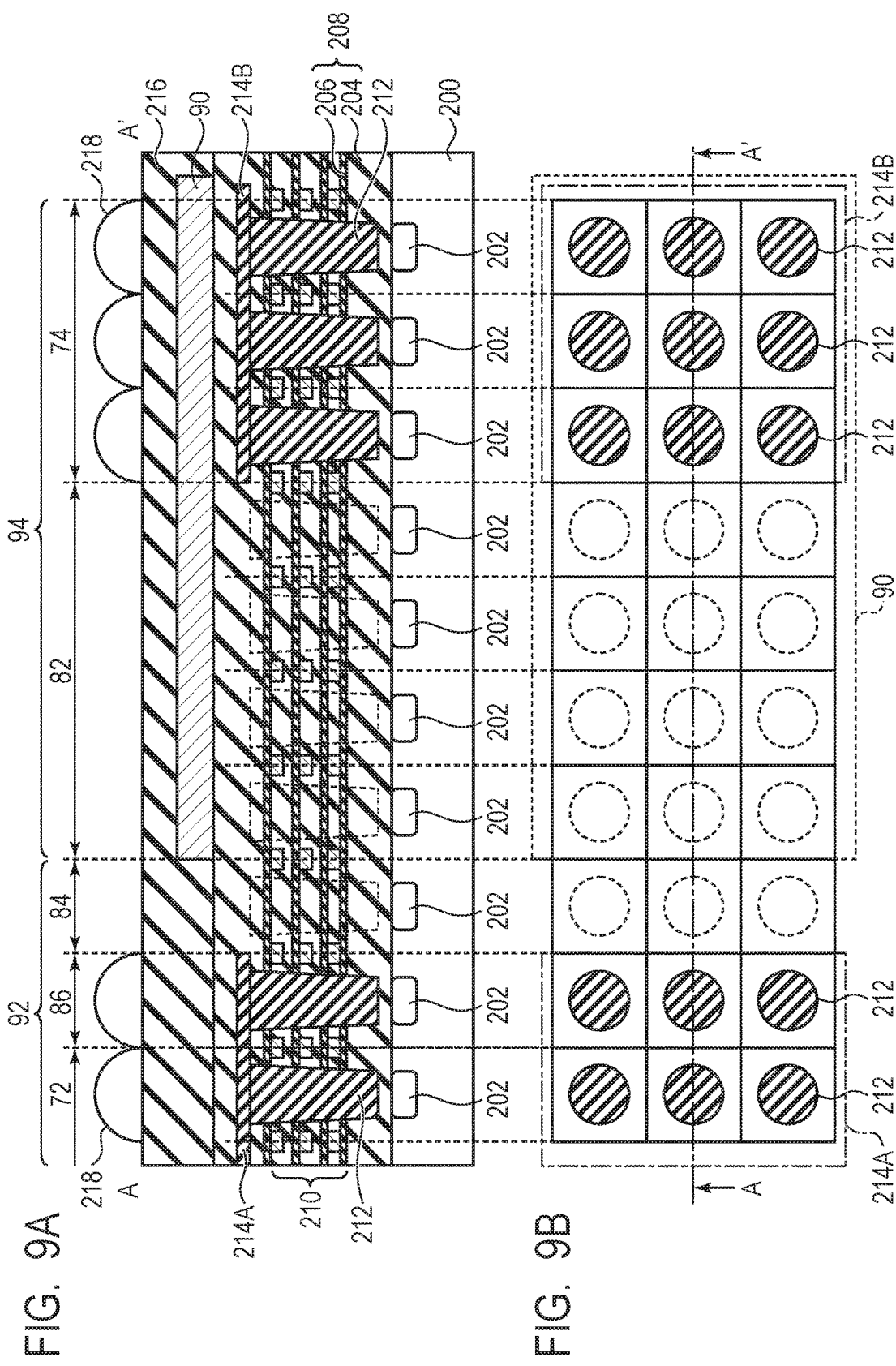
FIG. 9A and FIG. 9B are a cross-sectional view and a top view for illustrating a structure of an imaging device according to a fifth embodiment of the present invention.

An imaging device according to a fifth embodiment of the present invention is described with reference to FIG. 9A to FIG. 9B. The same components as those of the imaging devices according to the first to fourth embodiments illustrated in FIG. 1 to FIG. 8B are denoted by like reference symbols, and descriptions thereof are omitted or simplified.

FIG. 9A and FIG. 9B are a cross-sectional view and a top view for illustrating a structure of the imaging device according to the present embodiment. FIG. 9A is a cross-sectional view of the vicinity of the boundary between the opening region 92 and the light-shielding region 94, and corresponds to the cross-sectional view taken along the line A-A' of FIG. 6. FIG. 9B is a top view of three columns of pixels 12 including the pixels 12 adjacent to each other in the direction intersecting the line A-A' of FIG. 6.

As illustrated in FIG. 9A, the imaging device according to the present embodiment is different from the imaging device according to the third embodiment in that the microlenses 218 are not provided to any one of the pixels 12 arranged in the first region 82 and the second region 84 of the dummy pixel region 80.

With the configuration in which the microlenses 218 are not provided to any one of the pixels 12 arranged in the first region 82 and the second region 84 of the dummy pixel region 80, it is possible to reduce the amount of light entering from the second region 84 near the end of the opening region 92. With this configuration, it is possible to suppress the light propagating toward the OB region 74 to a much lower level.

In this manner, according to the present embodiment, it is possible to suppress the leakage of light to the OB region 74 and to eliminate the difference in output of the dark signal between the effective pixel region 72 and the OB region 74, and hence a good-quality image can be acquired with stability.

[Sixth Embodiment]

Figure 10:
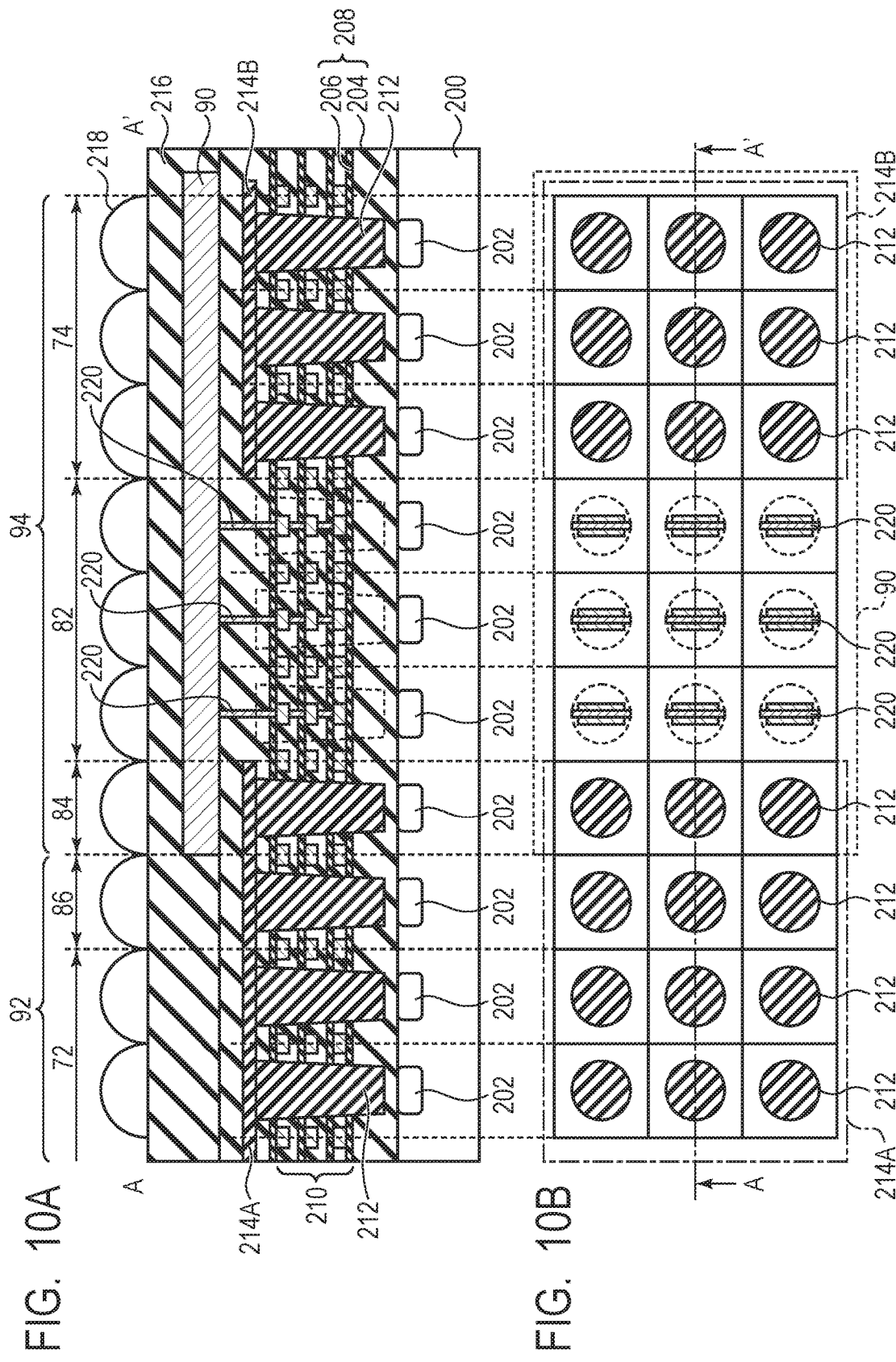
FIG. 10A and FIG. 10B are a cross-sectional view and a top view for illustrating a structure of an imaging device according to a sixth embodiment of the present invention.

An imaging device according to a sixth embodiment of the present invention is described with reference to FIG. 10A and FIG. 10B. The same components as those of the imaging devices according to the first to fifth embodiments illustrated in FIG. 1 to FIG. 9B are denoted by like reference symbols, and descriptions thereof are omitted or simplified.

FIG. 10A and FIG. 10B are a cross-sectional view and a top view for illustrating a structure of the imaging device according to the present embodiment. FIG. 10A is a cross-sectional view of the vicinity of the boundary between the opening region 92 and the light-shielding region 94, and corresponds to the cross-sectional view taken along the line A-A' of FIG. 2B. FIG. 10B is a top view of three columns of pixels 12 including the pixels 12 adjacent to each other in the direction intersecting the line A-A' of FIG. 2B.

As illustrated in FIG. 10A and FIG. 10B, the imaging device according to the present embodiment is different from the imaging device according to the first embodiment illustrated in FIG. 3A and FIG. 3B in that the insulating film 208 in the first region 82 of the dummy pixel region 80 further includes light-shielding walls 220.

In the imaging device according to the first embodiment, the optical waveguides 212 and the connecting portions 214A and 214B are not provided in the first region 82 of the dummy pixel region 80, and hence it is possible to suppress the propagation of light toward the OB region 74 via the optical waveguides 212 and the connecting portions 214A and 214B. However, when the refractive index of the second film 206 of the insulating film 208 is larger than the refractive index of the first film 204, the light propagating toward the OB region 74 through the second film 206 sometimes cannot be suppressed sufficiently because the light has the property of propagating through a region having a high refractive index. The imaging device according to the present embodiment is effective for suppressing such propagation of light through the insulating film 208.

The light-shielding walls 220 are each a structure formed simultaneously with the interconnection layers 210 in a manufacturing process of the interconnection layers 210, and is made of a material having the same characteristic as that of the interconnection layers 210, typically, Al, Cu, W, or other such metallic material exhibiting a light-shielding effect. Further, multi-level interconnection layers 210 are connected to each other through the first film 204 and the second film 206 of the insulating film 208, and the light-shielding wall 220 formed simultaneously with the interconnection layers 210 can also be formed so as to penetrate through the second film 206. The light-shielding walls 220 are thus arranged in the insulating film 208, to thereby be able to suppress the propagation of light through the second film 206. When the light-shielding wall 220 is formed over a plurality of layers in the same manner as the interconnection layers 210, a higher effect can be obtained. With the configuration in which the light-shielding wall 220 is connected also to the light-shielding film 90 as illustrated in FIG. 10A, it is possible to further enhance light-shielding performance. Although the light-shielding wall 220 is formed in the first film 204 or the second film 206 of the lowermost layer of the insulating film 208 in the example of FIG. 10A, the light-shielding wall 220 may be formed in the first film 204 and the second film 206 of the lowermost layer of the insulating film 208.

It suffices that the light-shielding wall 220 is arranged in a position that does not overlap with the interconnection layers 210 under the light-shielding film 90 when viewed from the upper surface. The propagation of light can be suppressed to a much lower level not only by the interconnection layers 210 but also by the light-shielding wall 220 owing to the presence of the light-shielding wall 220 in a position that does not overlap with the interconnection layers 210. In particular, it is preferred that the light-shielding wall 220 be arranged in a part (part indicated by the dotted lines in FIG. 10A and FIG. 10B) corresponding to a place where the optical waveguide 212 is arranged in an effective pixel or an OB pixel. The region above the photoelectric converter 202 in which the optical waveguide 212 is arranged is normally a region in which the interconnection layers 210 are not arranged or a region having a low interconnection density in order to secure light-receiving sensitivity. Therefore, with the arrangement of the light-shielding wall 220 in this part, it is possible to improve a light-shielding characteristic without adversely affecting a layout of the interconnection layers 210.

There is no particular limitation imposed on the shape of the light-shielding wall 220 when viewed from the upper surface, and appropriate changes can be made thereto depending on the pattern or the like of the interconnection layers 210. For example, in addition to such a thin rectangular shape as illustrated in FIG. 10B, a shape having square patterns or circular patterns may be employed.

Further, the light-shielding wall 220 may be connected to a power supply terminal (for example, VDD terminal), a reference voltage terminal (for example, GND terminal), or other such terminal for a constant voltage. Through the application of a fixed voltage to the light-shielding wall 220, it is possible to stabilize a potential of the light-shielding wall 220 and to suppress noise that occurs when the potential of the light-shielding wall 220 changes in conjunction with a circuit operation.

The imaging device according to the present embodiment is configured such that the light-shielding wall 220 is arranged in the position that does not overlap with the interconnection layers 210 under the light-shielding film 90 when viewed from the upper surface, but even when the imaging device is configured such that the light-shielding wall 220 is arranged in the position that overlaps with the interconnection layers 210, it is possible to suppress the amount of entering light to a level much lower than in the first embodiment.

In this manner, according to the present embodiment, it is possible to suppress the leakage of light to the OB region 74 and to eliminate the difference in output of the dark signal between the effective pixel region 72 and the OB region 74, and hence a good-quality image can be acquired with stability.

[Seventh Embodiment]

Figure 11:
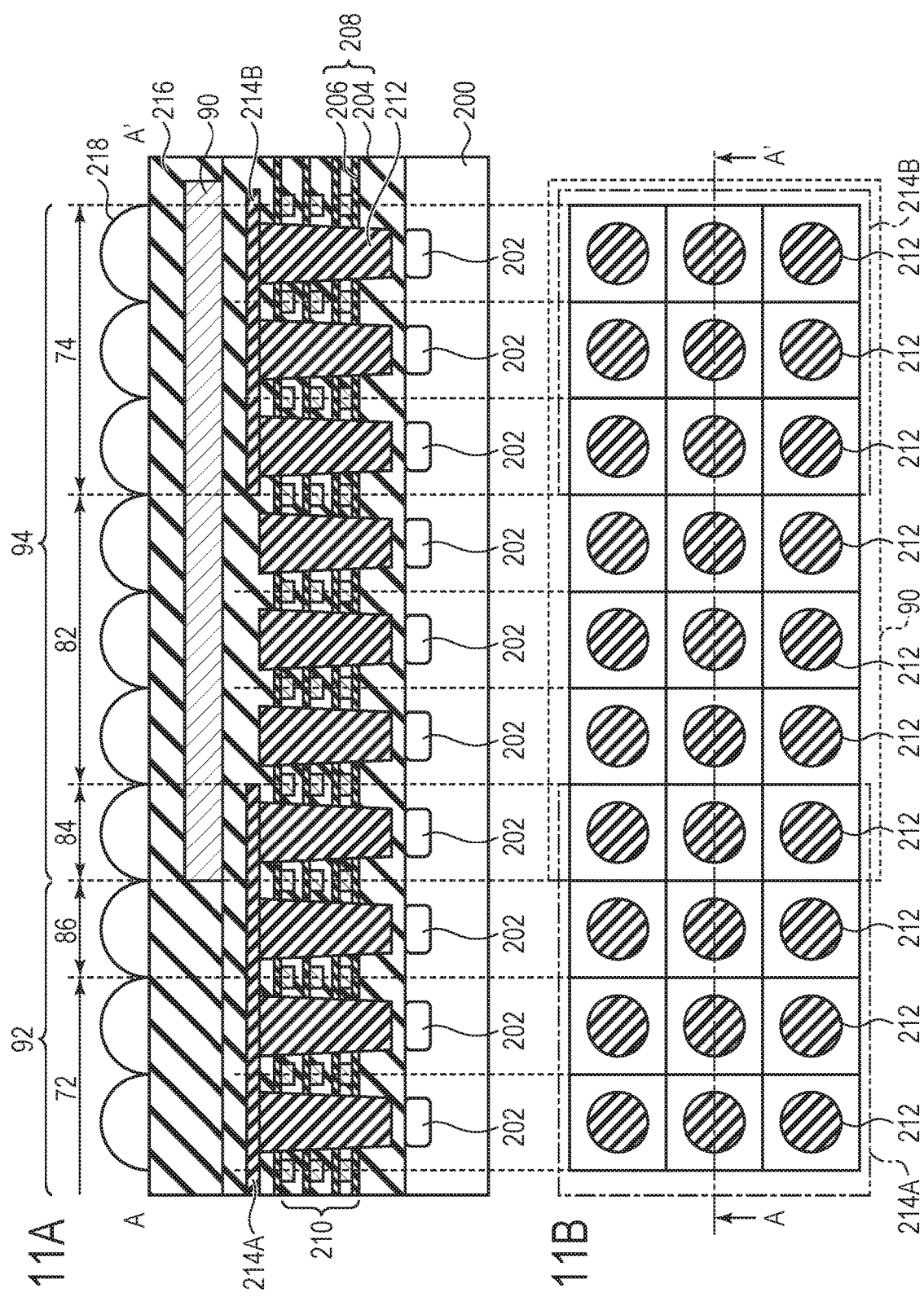
FIG. 11A and FIG. 11B are a cross-sectional view and a top view for illustrating a structure of an imaging device according to a seventh embodiment of the present invention.

An imaging device according to a seventh embodiment of the present invention is described with reference to FIG. 11A and FIG. 11B. The same components as those of the imaging devices according to the first to sixth embodiments illustrated in FIG. 1 to FIG. 10B are denoted by like reference symbols, and descriptions thereof are omitted or simplified.

FIG. 11A and FIG. 11B are a cross-sectional view and a top view for illustrating a structure of the imaging device according to the present embodiment. FIG. 11A is a cross-sectional view of the vicinity of the boundary between the opening region 92 and the light-shielding region 94, and corresponds to the cross-sectional view taken along the line A-A' of FIG. 2B. FIG. 11B is a top view of three columns of pixels 12 including the pixels 12 adjacent to each other in the direction intersecting the line A-A' of FIG. 2B.

As illustrated in FIG. 11A and FIG. 11B, the imaging device according to the present embodiment is different from the imaging device according to the first embodiment illustrated in FIG. 3A and FIG. 3B in that the optical waveguides 212 are provided in the first region 82 of the dummy pixel region 80. The connecting portion 214A and the connecting portion 214B are not provided in the first region 82 of the dummy pixel region 80, and are spaced apart from each other.

In the imaging device according to the comparative example exemplified in FIG. 4A and FIG. 4B, the connecting portion 214 is provided in the first region 82 of the dummy pixel region 80, and hence there are components of light propagating toward the OB region 74 through the connecting portion 214. In this respect, in the imaging device according to the present embodiment, the connecting portion 214 is discontinuous in the first region 82 of the dummy pixel region 80, and hence the amount of light propagating toward the OB region 74 can be reduced.

In this manner, according to the present embodiment, it is possible to suppress the leakage of light to the OB region 74 and to eliminate the difference in output of the dark signal between the effective pixel region 72 and the OB region 74, and hence a good-quality image can be acquired with stability.

[Eighth Embodiment]

Figure 12:
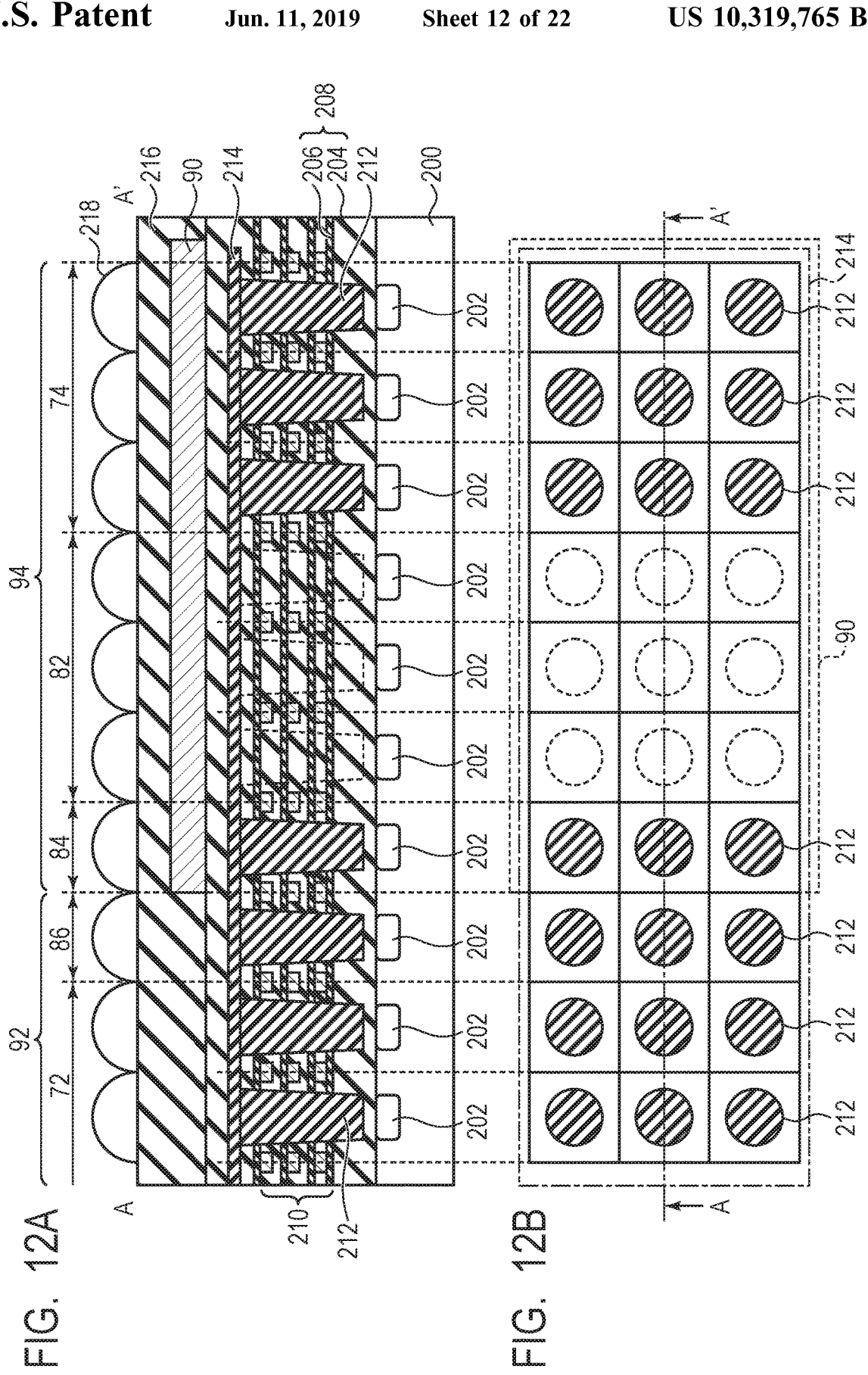
FIG. 12A and FIG. 12B are a cross-sectional view and a top view for illustrating a structure of an imaging device according to an eighth embodiment of the present invention.

An imaging device according to an eighth embodiment of the present invention is described with reference to FIG. 12A and FIG. 12B. The same components as those of the imaging devices according to the first to seventh embodiments illustrated in FIG. 1 to FIG. 11B are denoted by like reference symbols, and descriptions thereof are omitted or simplified.

FIG. 12A and FIG. 12B are a cross-sectional view and a top view for illustrating the imaging device according to the present embodiment. FIG. 12A is a cross-sectional view of the vicinity of the boundary between the opening region 92 and the light-shielding region 94, and corresponds to the cross-sectional view taken along the line A-A' of FIG. 2B. FIG. 12B is a top view of three columns of pixels 12 including the pixels 12 adjacent to each other in the direction intersecting the line A-A' of FIG. 2B.

As illustrated in FIG. 12A and FIG. 12B, the imaging device according to the present embodiment is different from the imaging device according to the first embodiment illustrated in FIG. 3A and FIG. 3B in that the connecting portion 214 is provided in the first region 82 of the dummy pixel region 80. That is, in the imaging device according to the present embodiment, the connecting portion 214 is provided over the entirety of the effective pixel region 72, the dummy pixel region 80, and the OB region 74. The optical waveguides 212 are not provided in the first region 82 of the dummy pixel region 80 in the same manner as in the first embodiment. That is, the pixels 12 including the optical waveguides 212 are arranged so as to be spaced apart from each other by at least a one-pixel pitch between the effective pixel region 72 and the OB region 74.

In the imaging device according to the comparative example exemplified in FIG. 4A and FIG. 4B, the optical waveguides 212 are provided in the first region 82 of the dummy pixel region 80, and hence there are components of light successively propagating through the arrayed optical waveguides 212 among components of light that have leaked from the side wall of the optical waveguide 212. In this respect, in the imaging device according to the present embodiment, the components of light successively propagating through the arrayed optical waveguides 212 are suppressed through the structure in which the optical waveguides 212 are not provided in the first region 82 of the dummy pixel region 80, and it is possible to reduce the amount of light that reaches the OB region 74.

Further, in the imaging device according to the present embodiment, the connecting portion 214 is provided over the entirety of the effective pixel region 72, the dummy pixel region 80, and the OB region 74, and hence it is possible to easily improve evenness of a film thickness of the connecting portion 214 and to suppress deterioration in image quality.

In a manufacturing process for the optical waveguide 212 and the connecting portion 214, after an opening portion for embedding the optical waveguide 212 is formed in the insulating film 208, an insulating material to become the optical waveguide 212 and the connecting portion 214 is deposited so as to fill the opening portion and cover the insulating film 208. Then, a surface of the deposited insulating film is polished by CMP (Chemical Mechanical Polishing) method to be flattened, to thereby integrally form the optical waveguide 212 and the connecting portion 214. With the configuration in which the connecting portion 214 is not provided in the first region 82 of the dummy pixel region 80, for example, the insulating material is deposited with a mask being arranged in the first region 82, and is then subjected to the flattening. Therefore, the polishing is conducted with different materials being provided in the first region 82 and the other region, and variations in polishing rate occur within a plane, which degrades the flatness of the surface. As a result, the flatness of formation surfaces of the color filter (not illustrated) and the microlens 218 that are arranged thereabove also deteriorates, and the optical characteristics deteriorate.

In this respect, in the imaging device according to the present embodiment, the connecting portion 214 can be formed through the polishing of the insulating film deposited over the entirety of the effective pixel region 72, the dummy pixel region 80, and the OB region 74, and hence it is possible to improve the evenness of the film thickness of the connecting portion 214. With this configuration, it is possible to suppress the deterioration in flatness due to the connecting portion 214 and to suppress an influence exerted on the image due to the deterioration.

In this manner, according to the present embodiment, it is possible to suppress the leakage of light to the OB region 74 and to eliminate the difference in output of the dark signal between the effective pixel region 72 and the OB region 74, and hence a good-quality image can be acquired with stability.

[Ninth Embodiment]

Figure 13:
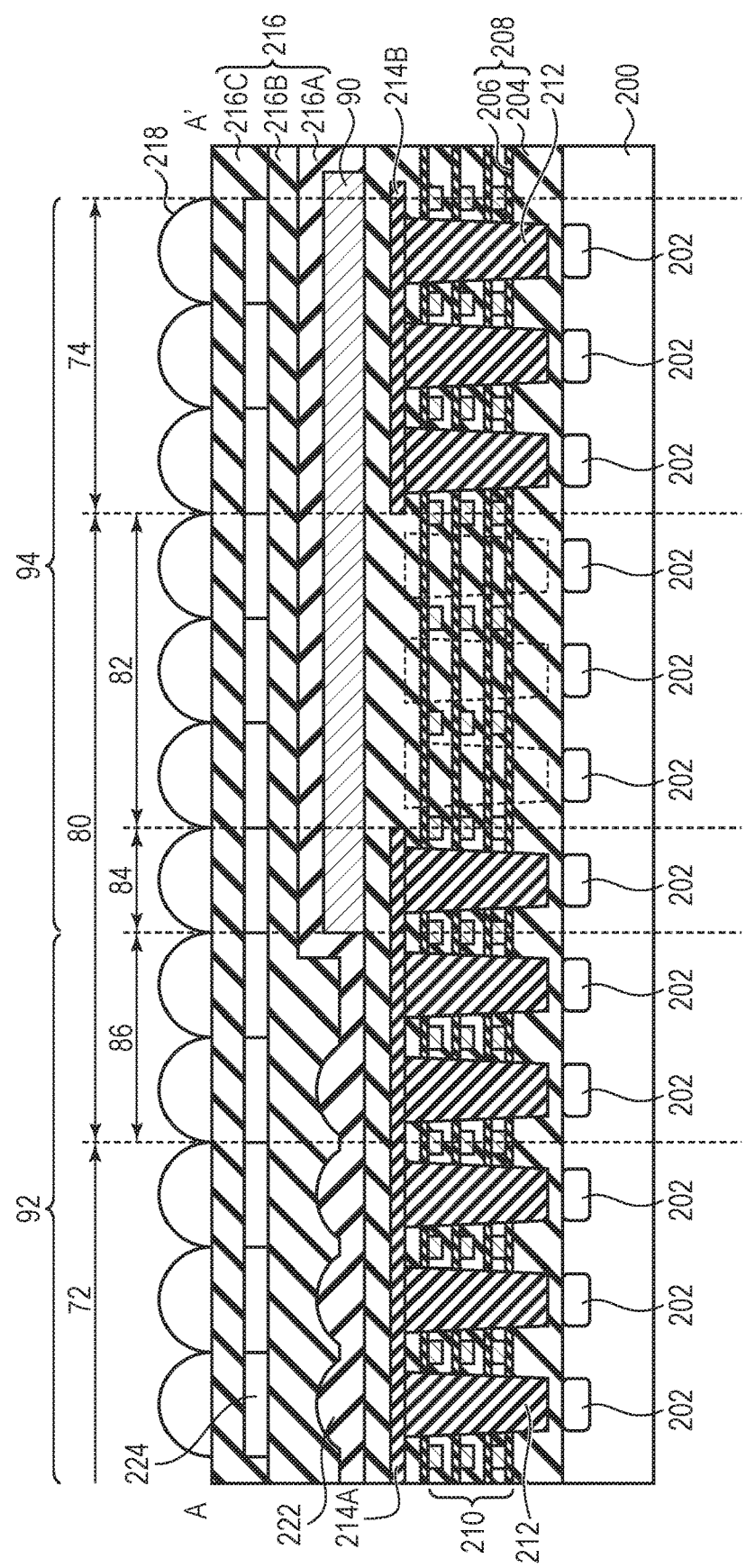
FIG. 13 is a cross-sectional view for illustrating a structure of an imaging device according to a ninth embodiment of the present invention.

An imaging device according to a ninth embodiment of the present invention is described with reference to FIG. 13. The same components as those of the imaging devices according to the first to eighth embodiments illustrated in FIG. 1 to FIG. 12B are denoted by like reference symbols, and descriptions thereof are omitted or simplified. FIG. 13 is a cross-sectional view for illustrating the imaging device according to the present embodiment. FIG. 13 is a cross-sectional view of the vicinity of the boundary between the opening region 92 and the light-shielding region 94, and corresponds to the cross-sectional view taken along the line A-A' of FIG. 2B.

As illustrated in FIG. 13, the imaging device according to the present embodiment is the same as the imaging device according to the first embodiment illustrated in FIG. 3A and FIG. 3B except that the imaging device according to the present embodiment further includes an inner-layer lens 222 and a color filter 224 within the insulating film 216.

That is, a passivation film is provided over the insulating film 208 provided with the light-shielding film 90. A passivation film 216A includes the inner-layer lenses 222 provided in association with the pixels 12 in at least the effective pixel region 72 on a one-to-one basis. A flattening film 216B is provided on the passivation film 216A provided with the inner-layer lens 222. The color filters 224 are provided on the flattening film 216B. A flattening film 216C is provided on the color filters 224. The microlenses 218 each configured to condense light on the photoelectric converter 202 are provided on the insulating film 216 including the passivation film 216A and the flattening films 216B and 216C in association with the pixels 12 on a one-to-one basis.

Also in the imaging device according to the present embodiment, the optical waveguides 212 and the connecting portion 214 are not provided to any one of the pixels 12 arranged in the first region 82 of the dummy pixel region 80 in the same manner as in the imaging device according to the first embodiment. Therefore, it is possible to suppress the leakage of light to the OB region 74 and to eliminate the difference in output of the dark signal between the effective pixel region 72 and the OB region 74, and hence a good-quality image can be acquired with stability.

[Tenth Embodiment]

An imaging device according to a tenth embodiment of the present invention is described with reference to FIG. 14 to FIG. 16. The same components as those of the imaging devices according to the first to ninth embodiments illustrated in FIG. 1 to FIG. 13 are denoted by like reference symbols, and descriptions thereof are omitted or simplified.

Figure 14:
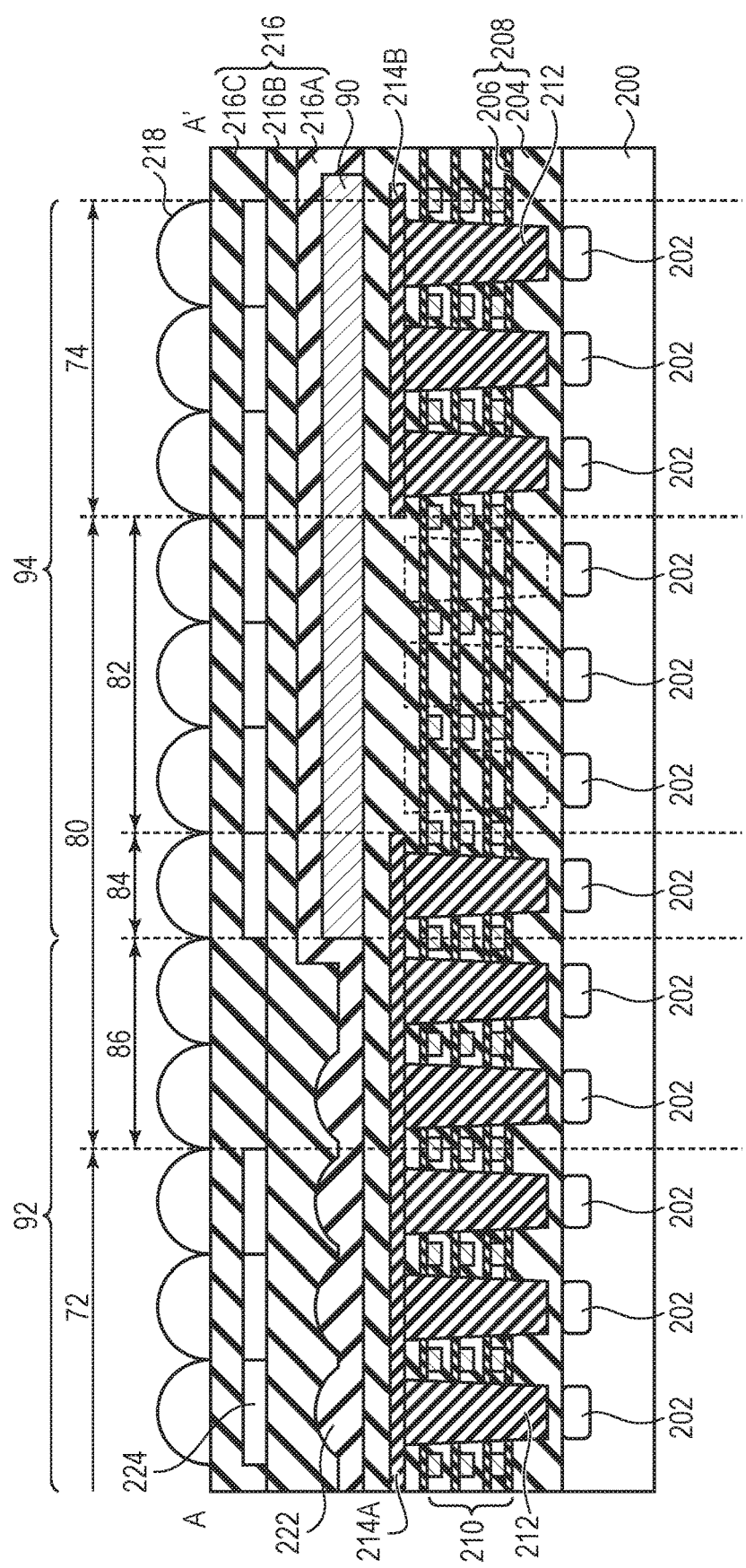
FIG. 14 is a cross-sectional view for illustrating a structure of an imaging device according to a tenth embodiment of the present invention.
Figure 15A:
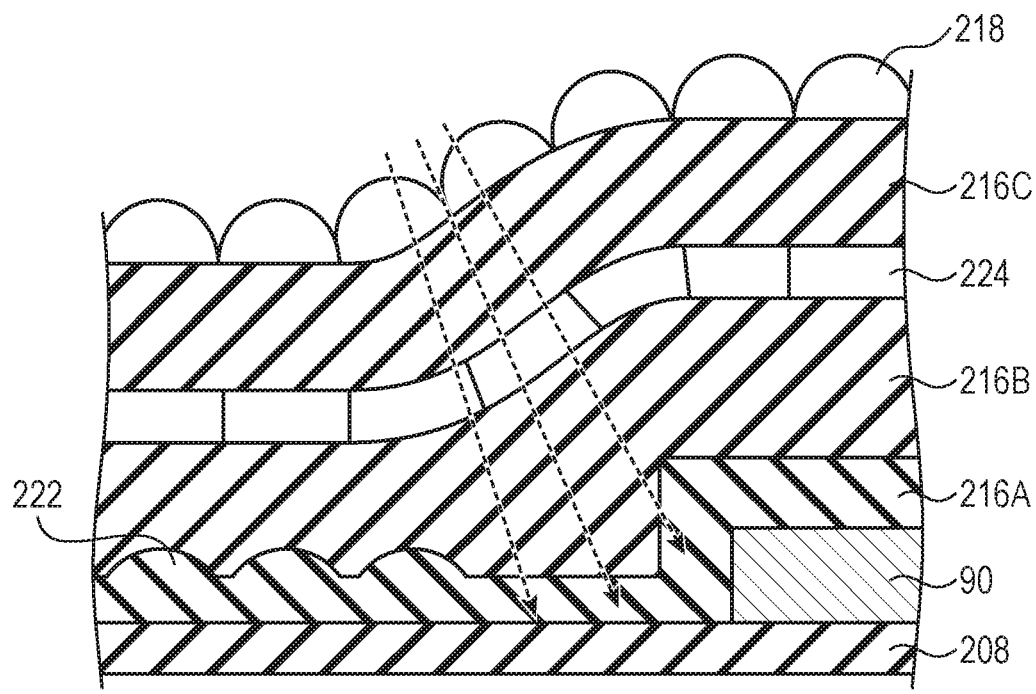
FIG. 15A and FIG. 15B are diagrams for illustrating an effect of the imaging device according to the tenth embodiment of the present invention.
Figure 15B:
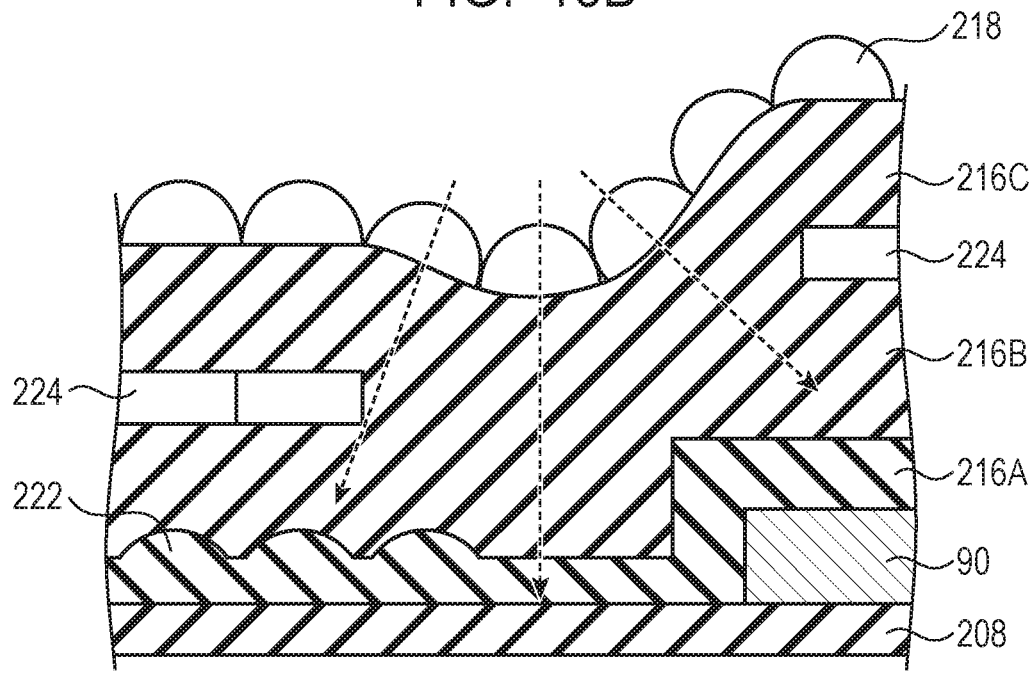

FIG. 14 is a cross-sectional view for illustrating the imaging device according to the present embodiment. FIG. 15A and FIG. 15B are diagrams for illustrating an effect of the imaging device according to the present embodiment. FIG. 16 is a cross-sectional view for illustrating an imaging device according to a modification example of the present embodiment. FIG. 14 and FIG. 16 are each a cross-sectional view of the vicinity of the boundary between the opening region 92 and the light-shielding region 94, and each correspond to the cross-sectional view taken along the line A-A' of FIG. 2B.

As illustrated in FIG. 14, the imaging device according to the present embodiment is the same as the imaging device according to the ninth embodiment illustrated in FIG. 13 except that the color filters 224 are not provided in the third region 86. The leakage of light to the OB region 74 can be suppressed to a much lower level through omission of the color filters 224 from the third region 86.

In regard to a mechanism capable of suppressing the leakage of light to the OB region 74 through the omission of the color filters 224 from the third region 86, the inventors of the present invention speculate as follows at the current time point.

In the third region 86 formed near the boundary between the opening region 92 and the light-shielding region 94, a difference in level due to the light-shielding film 90 exists on the insulating film 208. The difference in level is alleviated by the passivation film 216A and the flattening film 216B, but is difficult to eliminate completely. Therefore, a stepped portion ascribable to the difference in level due to the light-shielding film 90 occurs on a surface of the flattening film 216B in the third region 86.

The stepped portion that has occurred on the flattening film 216B also adversely affects the color filter 224 and the flattening film 216C formed thereon, and the microlens 218 formed thereabove. When the microlens 218 is formed on an inclined surface formed in the third region 86, a position of a focus imaged by the microlens 218 is directed toward the light-shielding region 94. As a result, as illustrated in FIG. 15A, light entering from an oblique direction is refracted toward the light-shielding region 94 side by the microlens 218, and causes the light leakage to the OB region 74.

In contrast, when the color filters 224 are not provided in the third region 86, the flattening film 216C sinks by an amount corresponding to the color filters 224 in the third region 86, and the stepped portion in the third region 86 becomes concave. As a result, the number of microlenses 218 directed toward the light-shielding region 94 becomes smaller as illustrated in FIG. 15B, and hence it is possible to reduce the light leakage to the OB region 74.

Figure 16:
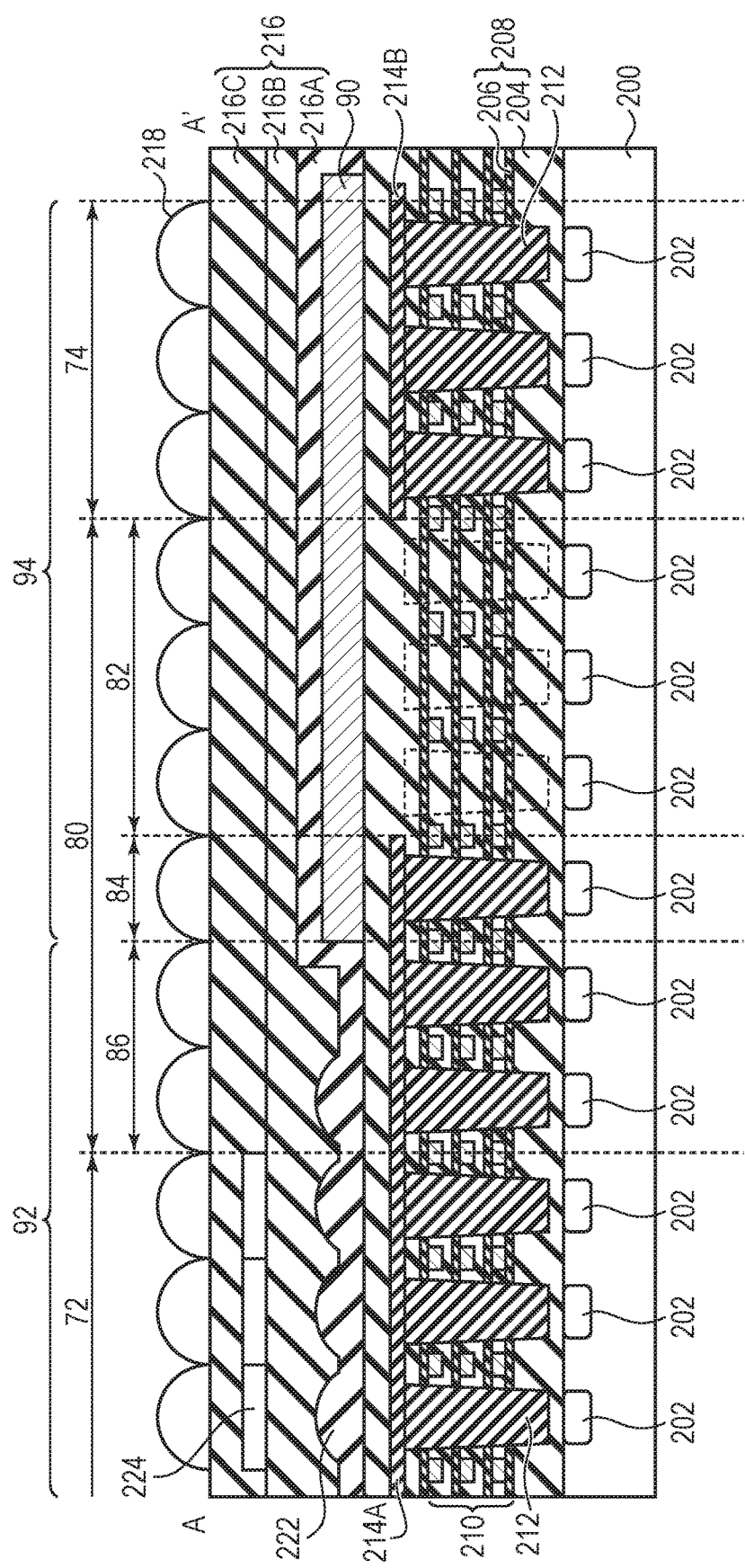
FIG. 16 is a cross-sectional view for illustrating a structure of an imaging device according to a modification example of the tenth embodiment of the present invention.

In the example illustrated in FIG. 14, the color filters 224 are arranged in the light-shielding region 94, but as illustrated in, for example, FIG. 16, the color filters 224 may be removed from the light-shielding region 94. Even in this case, the above-mentioned effect of the present embodiment can be obtained.

In this manner, according to the present embodiment, it is possible to suppress the leakage of light to the OB region 74 and to eliminate the difference in output of the dark signal between the effective pixel region 72 and the OB region 74, and hence a good-quality image can be acquired with stability.

[Eleventh Embodiment]

Figure 17:
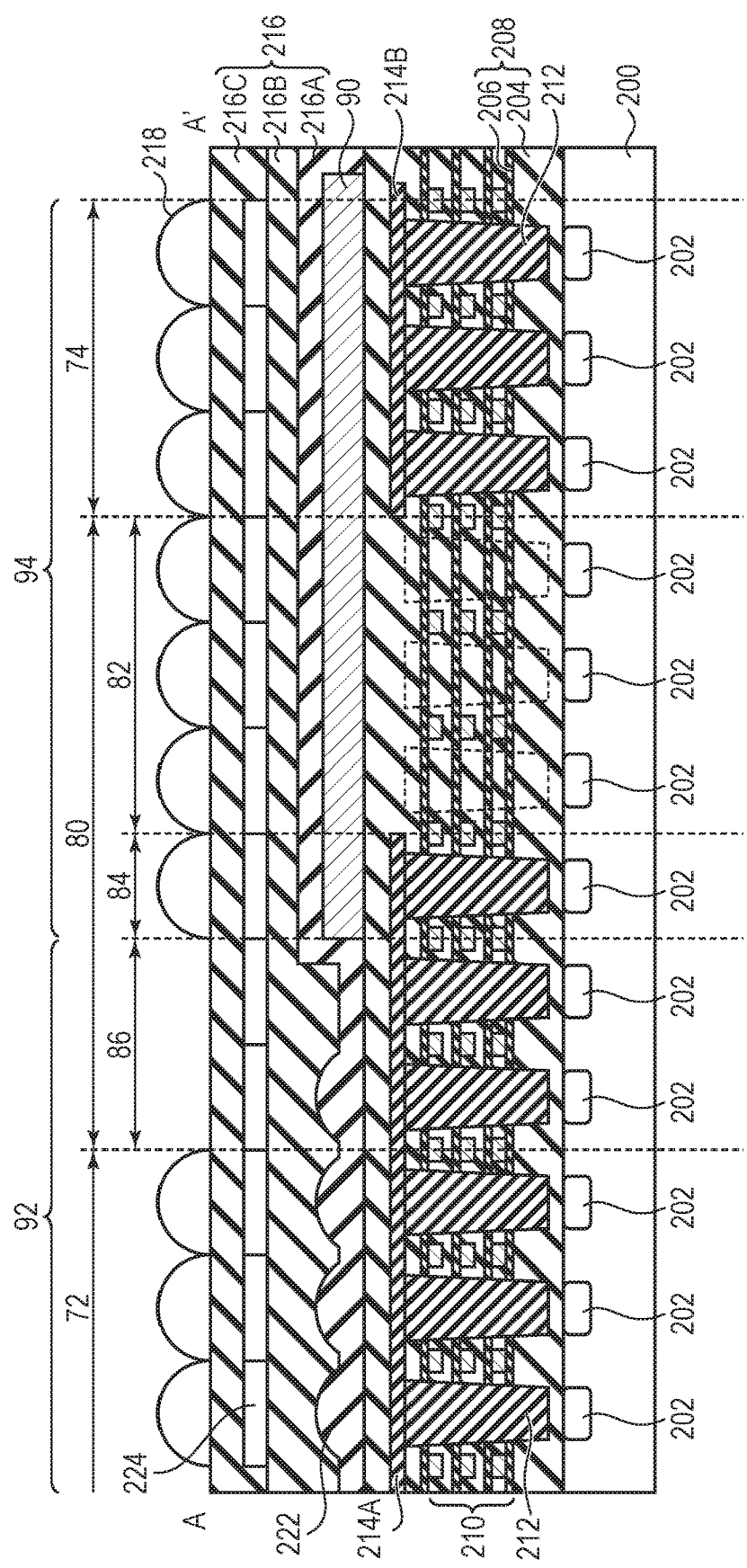
FIG. 17 is a cross-sectional view for illustrating a structure of an imaging device according to an eleventh embodiment of the present invention.
Figure 18:
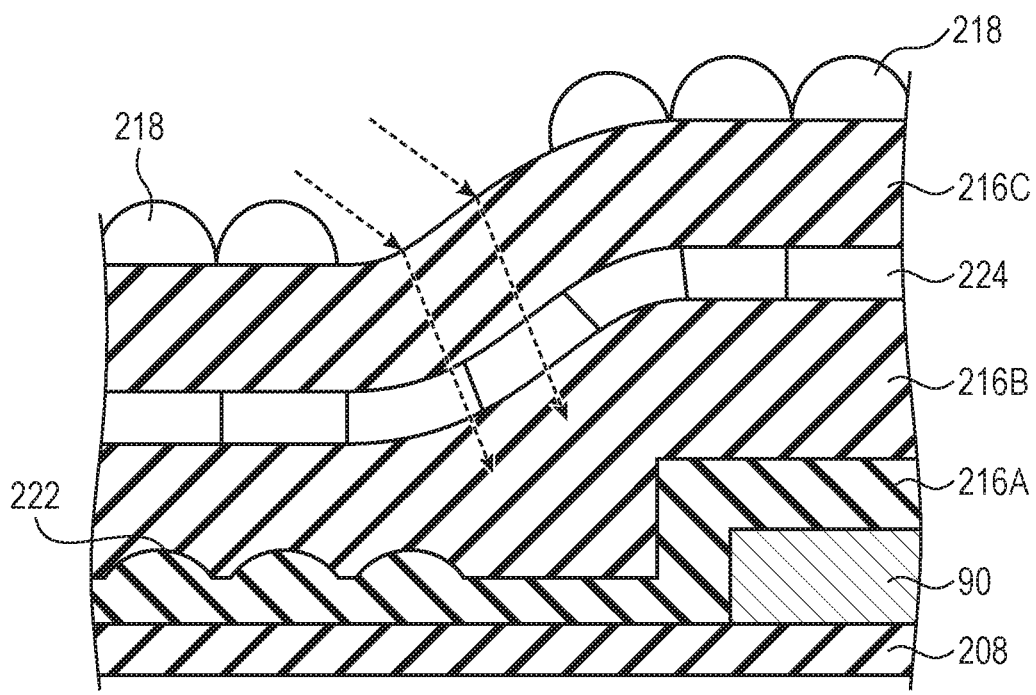
FIG. 18 is a diagram for illustrating an effect of the imaging device according to the eleventh embodiment of the present invention.
Figure 19:
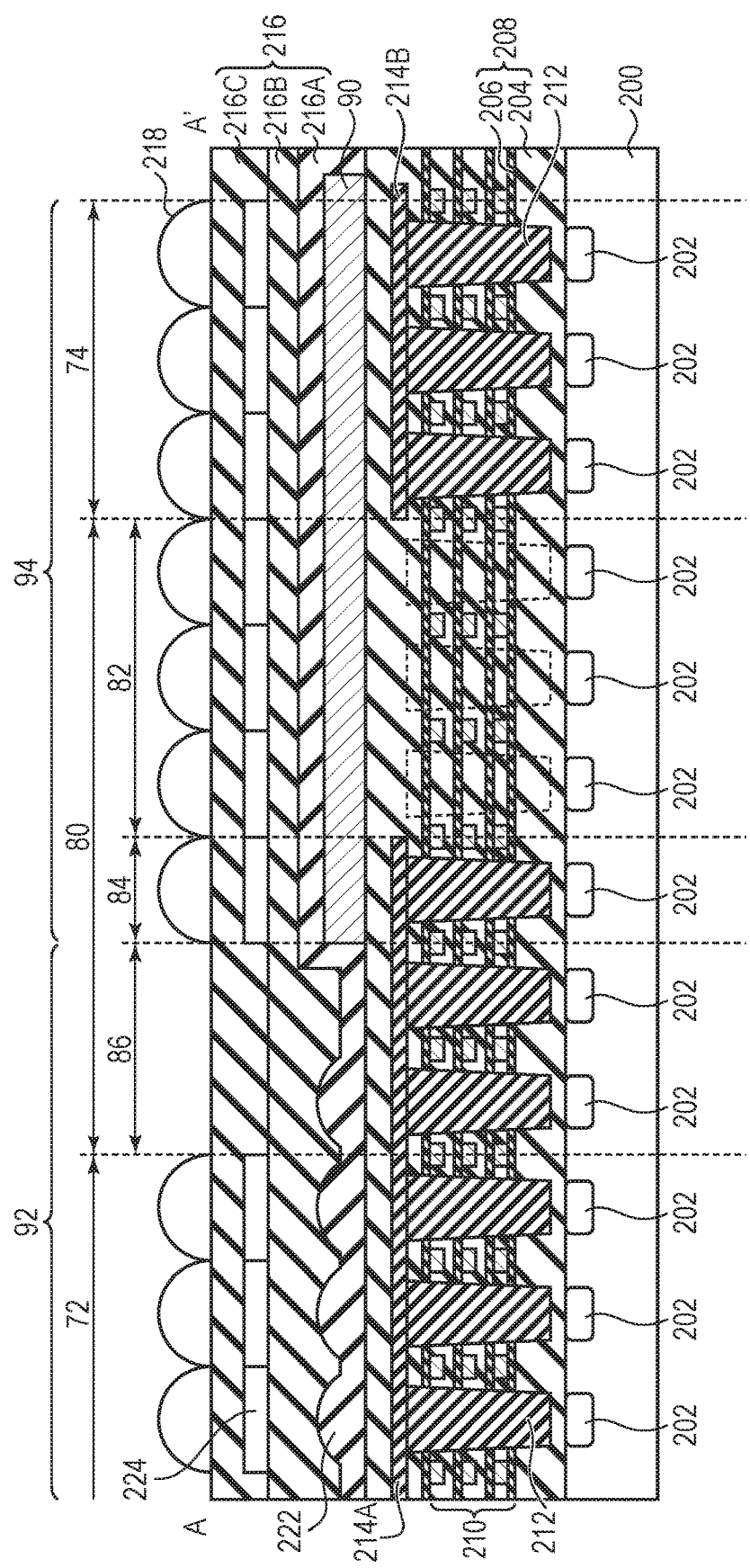
FIG. 19 is a cross-sectional view for illustrating a structure of an imaging device according to a modification example of the eleventh embodiment of the present invention.

An imaging device according to an eleventh embodiment of the present invention is described with reference to FIG. 17 to FIG. 19. The same components as those of the imaging devices according to the first to tenth embodiments illustrated in FIG. 1 to FIG. 16 are denoted by like reference symbols, and descriptions thereof are omitted or simplified. FIG. 17 is a cross-sectional view for illustrating the imaging device according to the present embodiment. FIG. 18 is a diagram for illustrating an effect of the imaging device according to the present embodiment. FIG. 19 is a cross-sectional view for illustrating an imaging device according to a modification example of the present embodiment. FIG. 17 and FIG. 19 are each a cross-sectional view of the vicinity of the boundary between the opening region 92 and the light-shielding region 94, and each correspond to the cross-sectional view taken along the line A-A' of FIG. 2B.

As illustrated in FIG. 17, the imaging device according to the present embodiment is the same as the imaging device according to the ninth embodiment illustrated in FIG. 13 except that the microlenses 218 are not provided in the third region 86. The leakage of light to the OB region 74 can be suppressed to a much lower level through omission of the microlenses 218 from the third region 86. In the example illustrated in FIG. 17, the microlenses 218 are arranged in the light-shielding region 94, but the microlenses 218 in the light-shielding region 94 may be removed.

In regard to the mechanism capable of suppressing the leakage of light to the OB region 74 through the omission of the microlenses 218 from the third region 86, which is not necessarily clear, the inventors of the present invention speculate as follows.

When the microlenses 218 are not provided in the third region 86, as illustrated in FIG. 18, the light entering from the oblique direction is refracted toward a side different from the light-shielding region 94 side by a surface of the flattening film 216C. As a result, the light propagating toward the OB region 74 side is reduced, and it is possible to reduce the light leakage to the OB region 74.

In the example illustrated in FIG. 17, the color filters 224 are arranged in the third region 86, but as illustrated in FIG. 19, the color filters 224 may be removed from the third region 86. In addition, the color filters 224 in the light-shielding region 94 may also be removed. In those cases, the light leakage to the OB region 74 can be reduced to a much lower level in combination with the effect described in the tenth embodiment.

In this manner, according to the present embodiment, it is possible to suppress the leakage of light to the OB region 74 and to eliminate the difference in output of the dark signal between the effective pixel region 72 and the OB region 74, and hence a good-quality image can be acquired with stability.

[Twelfth Embodiment]

Figure 20:
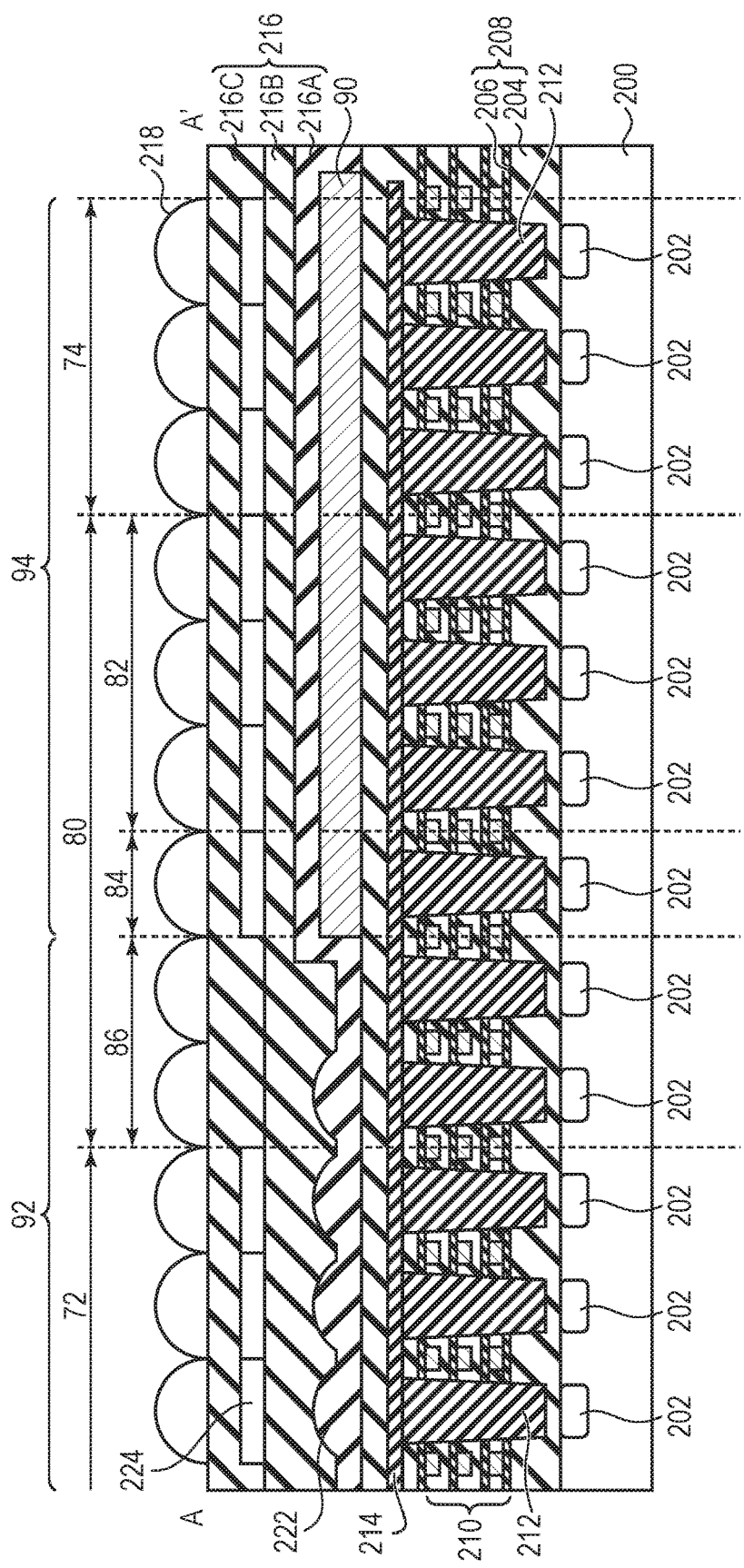
FIG. 20 is a cross-sectional view for illustrating a structure of an imaging device according to a twelfth embodiment of the present invention.

An imaging device according to a twelfth embodiment of the present invention is described with reference to FIG. 20. The same components as those of the imaging devices according to the first to eleventh embodiments illustrated in FIG. 1 to FIG. 19 are denoted by like reference symbols, and descriptions thereof are omitted or simplified. FIG. 20 is a cross-sectional view of the imaging device according to the present embodiment. FIG. 20 is a cross-sectional view of the vicinity of the boundary between the opening region 92 and the light-shielding region 94, and corresponds to the cross-sectional view taken along the line A-A' of FIG. 2B.

The imaging device according to the present embodiment is different from the imaging device according to the tenth embodiment in that the optical waveguide 212 and the connecting portion 214 in the first region 82 are not removed.

As described in the tenth embodiment, the removal of the color filters 224 from the third region 86 produces an effect of reducing the light propagating toward the OB region 74 side. The removal of the optical waveguides 212 and the connecting portion 214 from the first region 82 involves an intention to reduce light paths, but the light leakage to the OB region 74 can be reduced when the entering light is reduced in the first place. Therefore, also in the imaging device according to the present embodiment, the light leakage to the OB region 74 can be reduced to a much lower level than with the imaging device illustrated in FIG. 4A and FIG. 4B.

In the example of FIG. 20, both the optical waveguide 212 and the connecting portion 214 in the first region 82 are not removed, but only the connecting portion 214 may be removed as in the seventh embodiment, or only the optical waveguides 212 may be removed as in the eighth embodiment. Further, the microlens 218 in the third region may be removed as in the eleventh embodiment.

In this manner, according to the present embodiment, it is possible to suppress the leakage of light to the OB region 74 and to eliminate the difference in output of the dark signal between the effective pixel region 72 and the OB region 74, and hence a good-quality image can be acquired with stability.

[Thirteenth Embodiment]

Figure 21:
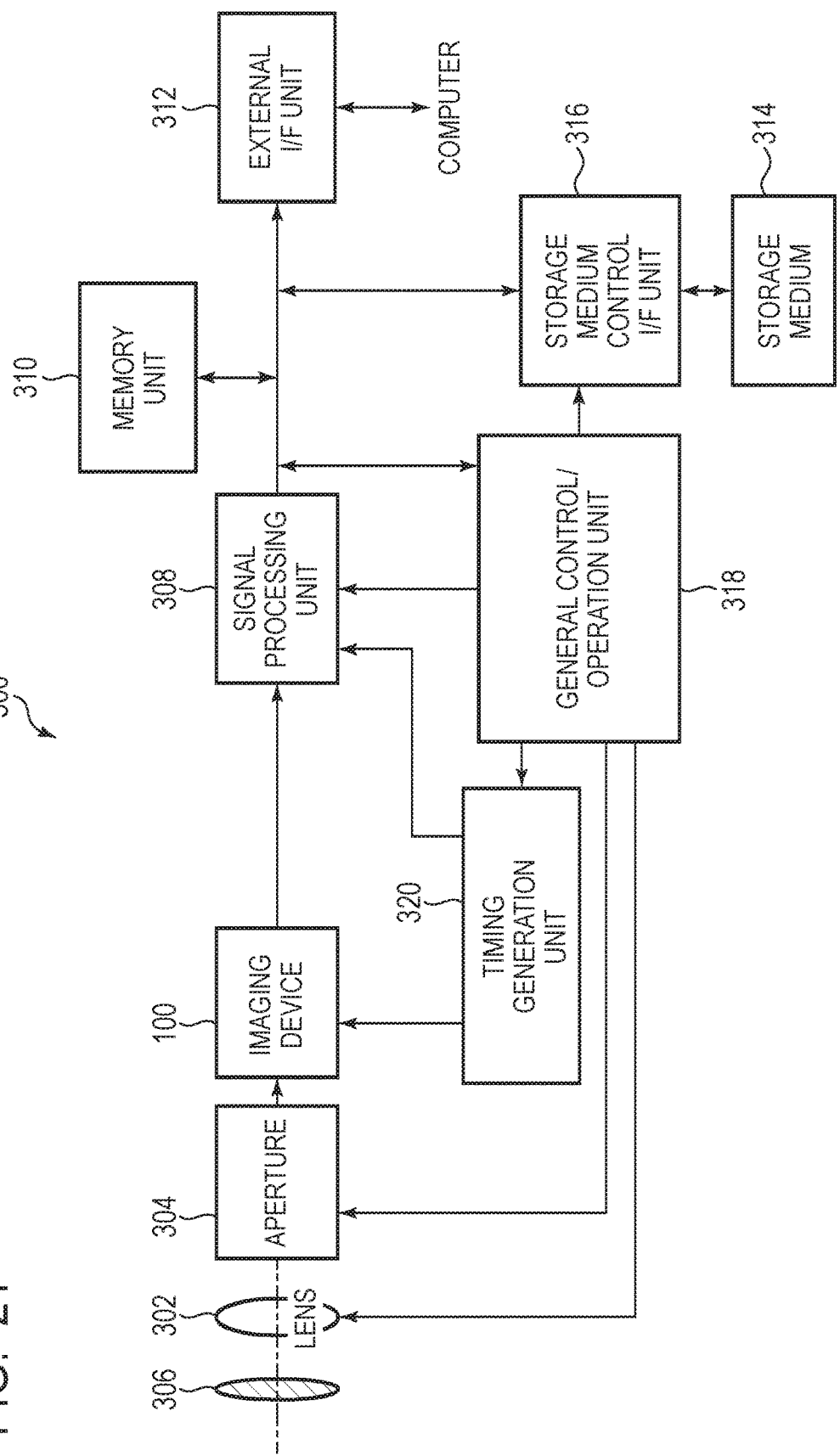
FIG. 21 is a block diagram for illustrating a schematic configuration of an imaging system according to a thirteenth embodiment of the present invention.

An imaging system according to a thirteenth embodiment of the present invention is described with reference to FIG. 21. The same components as those of the imaging devices according to the first to twelfth embodiments illustrated in FIG. 1 to FIG. 20 are denoted by like reference symbols, and descriptions thereof are omitted or simplified. FIG. 21 is a block diagram for illustrating a schematic configuration of the imaging system according to the present embodiment.

The imaging device 100 described above in each of the first to twelfth embodiments can be applied to various imaging systems. Examples of the imaging systems to which the above-mentioned imaging device 100 can be applied include a digital still camera, a digital camcorder, a monitoring camera, a copying machine, a FAX machine, a cellular phone, an on-vehicle camera, and an observation satellite, but there is no particular limitation imposed thereon. In addition, a camera module including a lens or other such optical system and the imaging device is included in the imaging system. FIG. 21 is a block diagram for illustrating the digital still camera as an example of those imaging systems.

An imaging system 300 exemplified in FIG. 21 includes the imaging device 100, a lens 302 configured to form an optical image of an object onto the imaging device 100, an aperture 304 for making an amount of light passing through the lens 302 variable, and a barrier 306 for protecting the lens 302. The lens 302 and the aperture 304 form an optical system configured to condense light onto the imaging device 100. The imaging device 100 corresponds to the imaging device 100 described in each of the first to twelfth embodiments, and is configured to convert the optical image imaged by the lens 302 into image data.

The imaging system 300 further includes a signal processing unit 308 configured to process a signal output from the imaging device 100. The signal processing unit 308 conducts A/D conversion for converting an analog signal output from the imaging device 100 into a digital signal. The signal processing unit 308 is further configured to conduct various kinds of correction processing and compression processing as the need arises, and to conduct an operation for outputting the image data. An AD converter included as a part of the signal processing unit 308 may be formed on a semiconductor substrate including the imaging device 100, or may be formed on another semiconductor substrate different from that of the imaging device 100. Further, the imaging device 100 and the signal processing unit 308 may be formed on the same semiconductor substrate.

The imaging system 300 further includes a general control/operation unit 318 configured to control execution of various arithmetic operations and an operation of the entire digital still camera and a timing generation unit 320 configured to output various timing signals to the imaging device 100 and the signal processing unit 308. In this case, the timing signal or the like may be input from the outside, and it suffices that the imaging system 300 includes at least the imaging device 100 and the signal processing unit 308 configured to process the signal output from the imaging device 100.

The imaging system 300 further includes a memory unit 310 for temporarily storing the image data and an external interface unit (external I/F unit) 312 for communicating to/from an external computer or the like. The imaging system 300 further includes a storage medium 314, for example, a semiconductor memory, for recording or reading imaging data and a storage medium control interface unit (storage medium control I/F unit) 316 for recording or reading data on the storage medium 314. The storage medium 314 may be built into the imaging system 300, or may be removably attached thereto.

The imaging system capable of acquiring a stable image even when strong light enters can be achieved through the application of the imaging device 100 according to each of the first to twelfth embodiments.

[Fourteenth Embodiment]

Figure 22A:
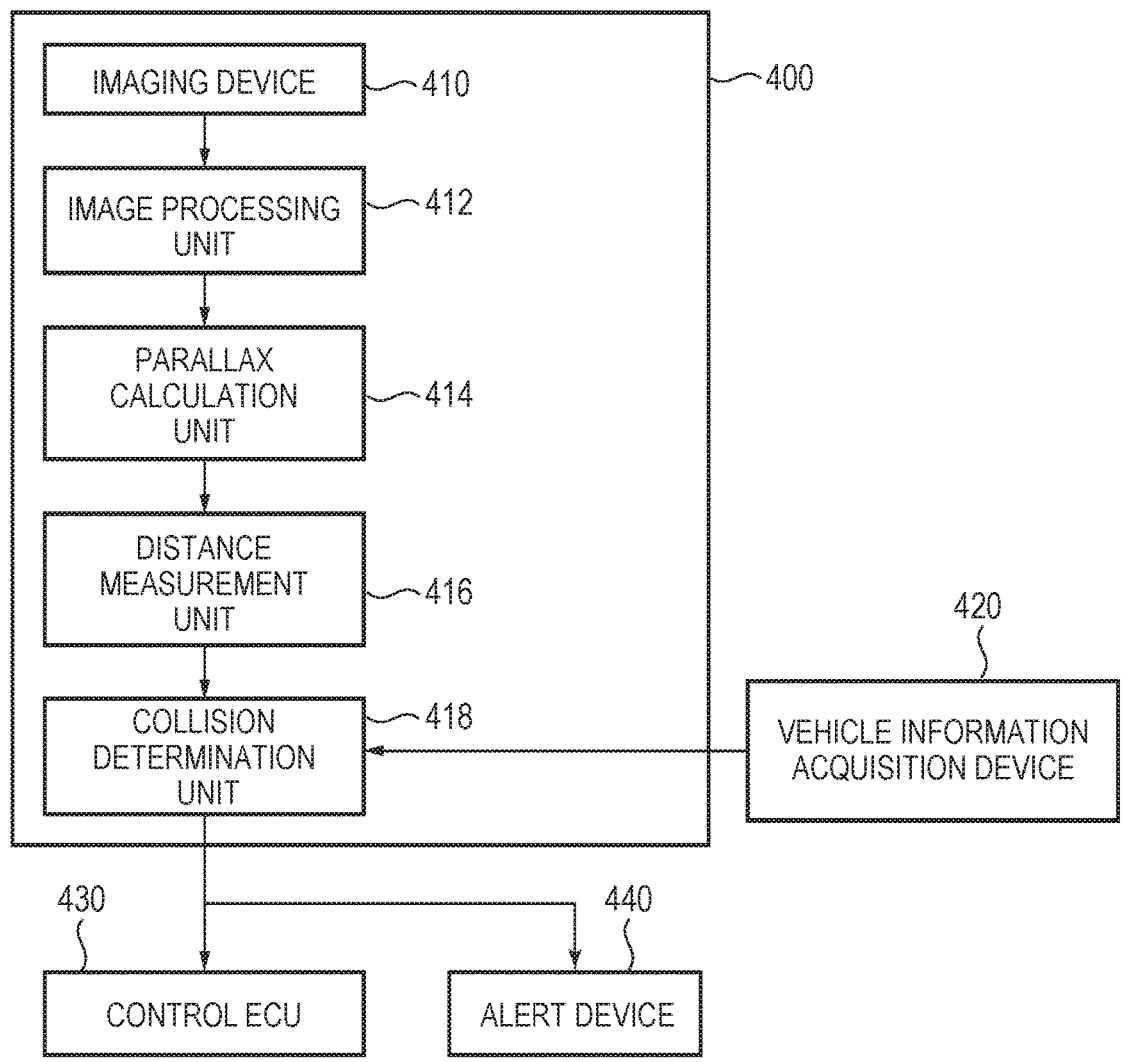
FIG. 22A is a diagram for illustrating an example of a configuration of an imaging system according to a fourteenth embodiment of the present invention.
Figure 22B:
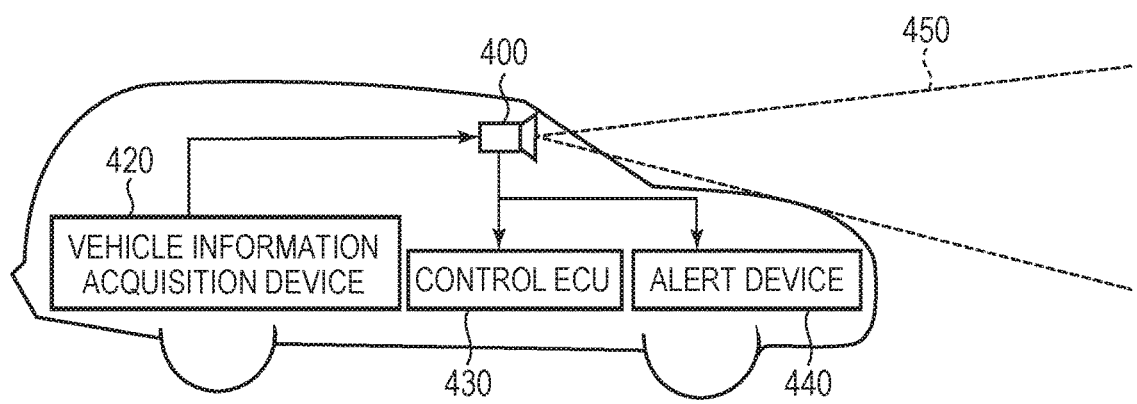
FIG. 22B is a diagram for illustrating an example of a configuration of a movable object according to the fourteenth embodiment of the present invention.

An imaging system and a movable object according to a fourteenth embodiment of the present invention is described with reference to FIG. 22A and FIG. 22B. FIG. 22A is an illustration of a configuration of the imaging system according to the present embodiment. FIG. 22B is an illustration of a configuration of the movable object according to the present embodiment.

FIG. 22A is an illustration of an example of the imaging system relating to an on-vehicle camera. An imaging system 400 includes an imaging device 410. The imaging device 410 corresponds to the imaging device 100 described above in any one of the first to twelfth embodiments. The imaging system 400 further includes an image processing unit 412 configured to conduct image processing on a plurality of pieces of image data acquired by the imaging device 410 and a parallax calculation unit 414 configured to calculate a parallax (phase difference of a parallax image) from the plurality of pieces of image data acquired by the imaging system 400. The imaging system 400 further includes a distance measurement unit 416 configured to calculate a distance from a target object based on the calculated parallax and a collision determination unit 418 configured to determine whether or not there is a possibility of a collision based on the calculated distance. In this case, the parallax calculation unit 414 and the distance measurement unit 416 are merely examples of a distance information acquisition unit configured to acquire distance information from the target object. That is, the distance information represents information relating to the parallax, a defocus amount, the distance from the target object, and the like. The collision determination unit 418 may determine whether or not there is a possibility of a collision through use of any one of those pieces of distance information. The distance information acquisition unit may be achieved by exclusively designed hardware, or may be achieved by a software module. The distance information acquisition unit may also be achieved by a field programmable gate array (FPGA), an application specific integrated circuit (ASIC), or the like, or may be achieved by a combination thereof.

The imaging system 400 is connected to a vehicle information acquisition device 420, and is capable of acquiring vehicle information including a vehicle speed, a yaw rate, and a steering angle. The imaging system 400 is further connected to a control ECU 430 being a control device configured to output a control signal for generating a braking force for a vehicle based on a determination result obtained by the collision determination unit 418. The imaging system 400 is further connected to an alert device 440 configured to issue an alert to a driver based on the determination result obtained by the collision determination unit 418. For example, when it is determined that the possibility of a collision is high based on the determination result obtained by the collision determination unit 418, the control ECU 430 controls the vehicle to avoid the collision and reduce damage if a collision occurs by, for example, braking, easing an accelerator, or suppressing engine output. The alert device 440 warns a user by, for example, emitting sound or the like of the alert, displaying alert information on a screen of a car navigation system, or applying vibrations to a seat belt or a steering wheel.

In the present embodiment, an image around the vehicle, for example, an image of a front or a rear of the vehicle is picked up by the imaging system 400. FIG. 22B is an illustration of an imaging system being used to pick up the image of the front (imaging range 450) of the vehicle. The vehicle information acquisition device 420 is configured to transmit an instruction to the imaging system 400 or the imaging device 410 so as to execute a predetermined operation. With such a configuration, it is possible to further increase the accuracy of distance measurement.

The example of controlling the vehicle so as not to collide with another vehicle has been described above, but the present embodiment may be applied to, for example, control for automatic driving conducted so as to follow another vehicle or control for automatic driving conducted so as not to deviate from a lane. Moreover, the imaging system can be applied not only to the vehicle including the own vehicle but also to the movable object (movable apparatus), for example, a vessel, an aircraft, or an industrial robot. In addition to the movable object, the imaging system can be widely applied to devices that use object recognition, for example, an intelligent transportation system (ITS).

[Modification Embodiment]

The present invention is not limited to the above-mentioned embodiments, and various modifications can be made thereto.

For example, in the above-mentioned embodiments, the connecting portion 214 or the connecting portions 214A and 214B are provided on the optical waveguides 212, but the connecting portion 214 or the connecting portions 214A and 214B are not necessarily provided. The connecting portions 214A and 214B are portions remaining on the insulating film 208 in the process of forming the optical waveguides 212 so as to be embedded in the insulating film 208. The connecting portions 214A and 214B can be removed when the optical waveguides 212 are being manufactured, but in that case, the polishing rate changes within a plane due to the difference between the materials forming the insulating film 208 and the optical waveguides 212, which causes a fear of degrading the flatness of the surface. When the flatness of the surface of the insulating film 208 deteriorates, the flatness of the formation surfaces of the color filter (not shown) and the microlens 218 that are arranged thereabove also deteriorates, and the optical characteristics deteriorate. When, for example, the flatness of the surface can be maintained even without leaving the connecting portion 214 or the connecting portions 214A and 214B, the connecting portion 214 or the connecting portions 214A and 214B are not necessarily caused to remain.

Further, in the imaging device according to the seventh or eighth embodiment, an interval between the light-shielding film 90 and the photoelectric converter 202 of each of the pixels 12 arranged in the first region 82 can be made smaller than an interval between the light-shielding film 90 and the photoelectric converter 202 of each of the pixels 12 arranged in the OB region 74 in the same manner as in the third and fourth embodiments.

Further, the above-mentioned embodiments can be combined with one another without limitation. For example, the imaging device according to each of the second to fifth embodiments may be provided with the light-shielding wall 220 of the sixth embodiment. Further, the arrangement of the color filters 224 and the microlenses 218 within the imaging device according to each of the ninth to twelfth embodiments may be applied to the imaging device according to each of the second to eighth embodiments.

Further, in the configuration of the first to twelfth embodiments described above, the optical waveguides 212 and the connecting portion 214 are integrally formed and are not arranged in a partial region of the dummy pixel region 80, but the region that is not provided with the optical waveguide 212 and the region that is not provided with the connecting portion 214 are not necessarily the same.

Further, the imaging system described in each of the thirteenth and fourteenth embodiments is merely an example of the imaging system to which the imaging device according to the present invention can be applied, and the imaging system to which the imaging device according to the present invention can be applied is not limited to the configurations illustrated in FIG. 21, FIG. 22A, and FIG. 22B.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-131351, filed Jul. 1, 2016, and Japanese Patent Application No. 2017-078633, filed Apr. 12, 2017, which are hereby incorporated by reference herein in their entirety.

What is claimed is:

1. An imaging device comprising:
an effective pixel region in which a plurality of pixels, each including a photoelectric converter, are arranged;
an optical black region in which a plurality of pixels, each including a photoelectric converter, are arranged, the optical black region being covered with a light-shielding film; and
a region arranged between the effective pixel region and the optical black region, in which pixels each including a photoelectric converter are arranged,
wherein the plurality of pixels arranged in the effective pixel region each include an optical waveguide arranged above the photoelectric converter,
wherein the plurality of pixels arranged in the optical black region each include an optical waveguide arranged above the photoelectric converter and under the light-shielding film, and
wherein at least some of the pixels arranged in the region between the effective pixel region and the optical black region do not include an optical waveguide arranged above the photoelectric converter.

2. An imaging device according to claim 1, further comprising:
a first connecting portion, which is made of a material having a same characteristic as a characteristic of the optical waveguide, provided so as to connect the optical waveguides of the plurality of pixels arranged in the effective pixel region to each other; and
a second connecting portion, which is made of the material having the same characteristic as the characteristic of the optical waveguide, provided so as to connect the optical waveguides of the plurality of pixels arranged in the optical black region to each other,
wherein the first connecting portion and the second connecting portion are arranged so as to be spaced apart from each other.

3. An imaging device according to claim 2, wherein the first connecting portion and the second connecting portion are made of a material including silicon nitride.

4. An imaging device according to claim 1, further comprising a connecting portion, which is made of a material having a same characteristic as a characteristic of the optical waveguide, provided so as to connect the optical waveguides of the plurality of pixels arranged in the effective pixel region and the plurality of pixels arranged in the optical black region to each other.

5. An imaging device according to claim 1, wherein the region arranged between the effective pixel region and the optical black region includes a first region, which is covered with the light-shielding film.

6. An imaging device according to claim 5, wherein the region arranged between the effective pixel region and the optical black region further includes a second region, which is arranged between the first region and the effective pixel region, covered with the light-shielding film in which pixels each including an optical waveguide are arranged.

7. An imaging device according to claim 6, wherein the region between the effective pixel region and the optical black region further includes a third region, which is arranged between the second region and the effective pixel region, not covered with the light-shielding film and in which pixels each including an optical waveguide are arranged.

8. An imaging device according to claim 7,
wherein the plurality of pixels arranged in the effective pixel region further include a color filter configured to select a wavelength of light entering the photoelectric converter, and
wherein the pixels arranged in the third region do not include the color filter.

9. An imaging device according to claim 7,
wherein the plurality of pixels arranged in the effective pixel region further include a microlens configured to condense light onto the photoelectric converter, and
wherein the pixels arranged in the third region do not include the microlens.

10. An imaging device according to claim 5, wherein the region between the effective pixel region and the optical black region further includes a second region, which is arranged between the first region and the effective pixel region, not covered with the light-shielding film and in which pixels including no optical waveguide are arranged.

11. An imaging device according to claim 10, wherein the region between the effective pixel region and the optical black region further includes a third region, which is arranged between the second region and the effective pixel region, not covered with the light-shielding film and in which pixels each including an optical waveguide are arranged.

12. An imaging device according to claim 10,
wherein the plurality of pixels arranged in the effective pixel region further include a microlens configured to condense light onto the photoelectric converter, and
wherein the pixels arranged in the second region do not include the microlens.

13. An imaging device according to claim 5, wherein the photoelectric converter and the light-shielding film of the pixels arranged in the first region have an interval between the photoelectric converter and the light-shielding film smaller than an interval between the photoelectric converter and the light-shielding film of the plurality of pixels arranged in the optical black region.

14. An imaging device according to claim 1, further comprising:
an interconnection layer; and
a light-shielding wall, which is provided in the region between the effective pixel region and the optical black region, made of a metal material.

15. An imaging device according to claim 14, wherein the light-shielding wall is provided to the pixels that doe not include the optical waveguide.

16. An imaging device according to claim 14, wherein the light-shielding wall is connected to a terminal for a constant voltage.

17. An imaging device according to claim 1, de wherein the pixels arranged in the region between the effective pixel region and the optical black region each have a readout circuit.

18. An imaging device according to claim 1, further comprising a plurality of insulating films and an interconnection layer arranged between the plurality of insulating films, wherein the optical waveguides are provided in the plurality of insulating films.

19. An imaging device according to claim 18, wherein the optical waveguides are made of a material including silicon nitride, and the plurality of insulating films are made of a material including silicon oxide.

20. An imaging device according to claim 1, wherein the plurality of pixels arranged in the optical black region is a pixel for outputting a reference signal to be used as a reference for a black level.

21. An imaging device according to claim 1, wherein the pixels arranged in the region between the effective pixel region and the optical black region are a pixel in which no signals are read out.

22. An imaging device according to claim 1, further including a plurality of insulating films and an interconnection layer arranged between the plurality of insulating films,
wherein in the pixels arranged in the region between the effective pixel region and the optical black region and including no optical waveguide above the photoelectric converter, the plurality of insulating films is arranged above the photoelectric converter at a position of a height same as a height where the optical waveguides in the effective pixel region are provided, or the plurality of insulating films is arranged above the photoelectric converter at a portion of a height same as a height where the optical waveguides in the optical black region are provided.

23. An imaging device comprising:
an effective pixel region in which a plurality of pixels, each including a photoelectric converter and an optical waveguide arranged above the photoelectric converter, are arranged;
an optical black region covered with a light-shielding film, in which a plurality of pixels, each including a photoelectric converter and an optical waveguide arranged above the photoelectric converter and under the light-shielding film, are arranged;
a first connecting portion, which is made of a material having a same characteristic as a characteristic of the optical waveguide, provided so as to connect the optical waveguides of the plurality of pixels arranged in the effective pixel region to each other; and
a second connecting portion, which is made of the material having the same characteristic as the characteristic of the optical waveguide, provided so as to connect the optical waveguides of the plurality of pixels arranged in the optical black region to each other,
wherein the first connecting portion and the second connecting portion are arranged so as to be spaced apart from each other.

24. An imaging system, comprising:
the imaging device according to claim 23; and
a signal processing unit configured to process a signal output from the imaging device.

25. A movable object, comprising:
the imaging device according to claim 23;
a distance information acquisition unit configured to acquire distance information on a distance to a target object from a parallax image that is based on a signal output from the imaging device; and
a control unit configured to control the movable object based on the distance information.

26. An imaging device according to claim 23, further comprising a plurality of insulating films and an interconnection layer arranged between the plurality of insulating films, wherein the optical waveguides are provided in the plurality of insulating films.

27. An imaging device according to claim 26, wherein the optical waveguides are made of a material including silicon nitride, and the plurality of insulating films are made of a material including silicon oxide.

28. An imaging device according to claim 23, wherein the first connecting portion and the second connecting portion are made of a material including silicon nitride.

29. An imaging device according to claim 23, wherein the plurality of pixels arranged in the optical black region is a pixel for outputting a reference signal to be used as a reference for a black level.

30. An imaging device according to claim 23, further comprising a region between the effective pixel region and the optical black region,
wherein pixels arranged in the region between the effective pixel region and the optical black region are a pixel in which no signals are read out.

31. An imaging device according to claim 23, further comprising:
a region between the effective pixel region and the optical black region, in which pixels each including a photoelectric converter are arranged;
an interconnection layer; and
a light-shielding wall, which is provided in the region between the effective pixel region and the optical black region, made of a metal material.

32. An imaging device according to claim 31, wherein the light-shielding wall is connected to a terminal for a constant voltage.

33. An imaging device comprising:
an effective pixel region in which a plurality of pixels, each including a photoelectric converter and an optical waveguide arranged above the photoelectric converter, are arranged, the optical waveguide being made of a material including silicon nitride;
an optical black region covered with a light-shielding film, in which a plurality of pixels, each including a photoelectric converter and an optical waveguide arranged above the photoelectric converter and under the light-shielding film, are arranged, the optical waveguide being made of a material including silicon nitride;
a first connecting portion provided so as to connect the optical waveguides of the plurality of pixels arranged in the effective pixel region to each other, the first connecting portion being made of a material including silicon nitride; and
a second connecting portion provided so as to connect the optical waveguides of the plurality of pixels arranged in the optical black region to each other, the second connecting portion being made of a material including silicon nitride,
wherein the first connecting portion and the second connecting portion are arranged so as to be spaced apart from each other.

34. An imaging device according to claim 33 further comprising a plurality of insulating films and an interconnection layer arranged between the plurality of insulating films, wherein the optical waveguides are provided in the plurality of insulating films.

35. An imaging device according to claim 34, wherein the plurality of insulating films are made of a material including silicon oxide.

36. An imaging device according to claim 33, wherein the plurality of pixels arranged in the optical black region is a pixel for outputting a reference signal to be used as a reference for a black level.

37. An imaging device according to claim 33, further comprising a region arranged between the effective pixel region and the optical black region, in which pixels each including a photoelectric converter are arranged,
wherein the pixels arranged in the region between the effective pixel region and the optical black region are a pixel in which no signals are read out.

38. An imaging device according to claim 33, further comprising:
a region arranged between the effective pixel region and the optical black region, in which pixels each including a photoelectric converter are arranged;
an interconnection layer; and
a light-shielding wall, which is provided in the region between the effective pixel region and the optical black region, made of a metal material.

39. An imaging system, comprising:
the imaging device according to claim 33; and
a signal processing unit configured to process a signal output from the imaging device.

40. A movable object, comprising:
the imaging device according to claim 33;
a distance information acquisition unit configured to acquire distance information on a distance to a target object from a parallax image that is based on a signal output from the imaging device; and
a control unit configured to control the movable object based on the distance information.

* * * * *